(12) United States Patent
Makiyama

(10) Patent No.: US 11,024,730 B2
(45) Date of Patent: Jun. 1, 2021

(54) NITRIDE SEMICONDUCTOR DEVICE AND MANUFACTURING METHOD FOR THE SAME

(71) Applicant: FUJITSU LIMITED, Kawasaki (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 124 days.

(21) Appl. No.: 16/295,207

(22) Filed: Mar. 7, 2019

(65) Prior Publication Data

US 2019/0207018 A1 Jul. 4, 2019

Related U.S. Application Data

(63) Continuation of application No. PCT/JP2018/006034, filed on Feb. 20, 2018.

(30) Foreign Application Priority Data

Mar. 31, 2017 (JP) .............................. JP2017-071862

(51) Int. Cl.
*H01L 29/66* (2006.01)
*H01L 29/778* (2006.01)
(Continued)

(52) U.S. Cl.
CPC .... *H01L 29/7783* (2013.01); *H01L 29/66462* (2013.01); *H01L 29/7786* (2013.01);
(Continued)

(58) Field of Classification Search
CPC ........... H01L 29/7783; H01L 29/66462; H01L 29/7786; H01L 29/2003; H01L 29/41766; H01L 29/42376
(Continued)

(56) References Cited

U.S. PATENT DOCUMENTS 8,742,459 B2 * 6/2014 Mishra ................ H01L 21/0254
257/194
2002/0036287 A1 * 3/2002 Yu ......................... H01L 29/802
257/20
(Continued)

FOREIGN PATENT DOCUMENTS

JP 2004-327892 11/2004
JP 2005-086102 3/2005
(Continued)

OTHER PUBLICATIONS

International Search Report, mailed in connection with PCT/JP2018/006034 and dated May 22, 2018 (2 pages).
(Continued)

*Primary Examiner* — Calvin Y Choi
(74) *Attorney, Agent, or Firm* — Fujitsu Patent Center

(57) ABSTRACT

A nitride semiconductor device includes a first nitride semiconductor layer; a back-barrier layer that contains InGaN provided on the first nitride semiconductor layer; and a second nitride semiconductor layer that is provided on the back-barrier layer, wherein, in the back-barrier layer, in a thickness direction, an In composition increases at a first interface with the first nitride semiconductor layer, and the In composition is continuously reduced toward a second interface with the second nitride semiconductor layer.

27 Claims, 24 Drawing Sheets

(51) Int. Cl.
  *H01L 29/20*   (2006.01)
  *H01L 29/423*  (2006.01)
  *H01L 29/417*  (2006.01)

(52) U.S. Cl.
  CPC .... *H01L 29/2003* (2013.01); *H01L 29/41766* (2013.01); *H01L 29/42376* (2013.01)

(58) Field of Classification Search
  USPC ........................................................ 257/194
  See application file for complete search history.

(56) References Cited

U.S. PATENT DOCUMENTS

| | | | |
|---|---|---|---|
| 2004/0211976 A1 | 10/2004 | Twynam | |
| 2006/0255364 A1* | 11/2006 | Saxler | H01L 29/66462 257/192 |
| 2008/0237606 A1 | 10/2008 | Kikkawa et al. | |
| 2013/0256685 A1 | 10/2013 | Ohki | |
| 2015/0200257 A1 | 7/2015 | Kim et al. | |
| 2017/0179271 A1* | 6/2017 | Fenwick | H01L 29/66462 |

FOREIGN PATENT DOCUMENTS

| | | |
|---|---|---|
| JP | 2006-196557 | 7/2006 |
| JP | 2006-222191 | 8/2006 |
| JP | 2008-016588 | 1/2008 |
| JP | 2008-252034 | 10/2008 |
| JP | 2013-171854 | 9/2013 |
| JP | 2013-211481 | 10/2013 |
| JP | 2015-135946 | 7/2015 |
| JP | 2016-105499 | 6/2016 |
| JP | 2016-213507 | 12/2016 |

OTHER PUBLICATIONS

Written Opinion of the International Searching Authority mailed in connection with PCT/JP2018/006034 and dated May 22, 2018, with partial English translation (17 pages).

Japanese Office Action dated Mar. 23, 2021 for corresponding Japanese Patent Application No. 2017-071862 with, English Translation, 17 pages.

* cited by examiner $V_g=-2.5V$, $V_d=10V$ $V_g=-2.5V$, $V_d=10V$

NITRIDE SEMICONDUCTOR DEVICE AND MANUFACTURING METHOD FOR THE SAME

CROSS-REFERENCE TO RELATED APPLICATION

This application is a continuation application of International Application PCT/JP2018/006034, filed on Feb. 20, 2018 and designated the U.S., the entire contents of which are incorporated herein by reference. The International Application PCT/JP2018/006034 is based upon and claims the benefit of priority of the prior Japanese Patent Application No. 2017-071862, filed on Mar. 31, 2017, the entire contents of which are incorporated herein by reference.

FIELD

The embodiments discussed herein are related to a nitride semiconductor device and a manufacturing method for the same.

BACKGROUND

In order to realize high output of a compound semiconductor device, a HEMT using a nitride semiconductor which may generate highly-concentrated two-dimensional electron gases having high piezoelectric polarization and spontaneous polarization has been actively developed. In recent years, instead of an electron supply layer (barrier layer) of AlGaN of the related art, an In-based nitride semiconductor such as InAlGaN having higher spontaneous polarization or high piezoelectric polarization for a GaN channel has been examined to be used for an electron supply layer. A barrier layer of the In-based nitride semiconductor having high spontaneous polarization may derive highly-concentrated two-dimensional electron gases even if the layer is thin, and thus attracts attention as a material having both high output property and high frequency property. Such a high two-dimensional electron gas density realizes a high current density. In a HEMT using GaN as a channel material, a high voltage operation is possible due to a high dielectric breakdown voltage. Japanese Laid-open Patent Publication No. 2016-105499 and Japanese Laid-open Patent Publication No. 2004-327892 are examples of the related art.

In recent years, further micronizing of a nitride semiconductor device has been progressing. In a nitride semiconductor device for high frequency use only, having a fine gate electrode, a drain leakage current bypassing a gate depletion layer in an OFF state occurs. The leakage current reduces controllability for a drain current due to application of a gate voltage, and thus reduces efficiency of a nitride semiconductor device. A fixed leakage current in an OFF state also impedes a high voltage operation of the device. In order to cope with this problem, many research institutes are developing a technique of reducing a leakage current using a so-called back-barrier layer.

However, even in a case where a back-barrier layer is used, it is difficult to suppress a short channel effect, for example, in a high voltage operation by sufficiently reducing a leakage current. In light of the above description, it is desirable to sufficiently suppress the short channel effect.

SUMMARY

According to an aspect of the embodiments, a nitride semiconductor device includes a first nitride semiconductor layer; a back-barrier layer that contains InGaN provided on the first nitride semiconductor layer; and a second nitride semiconductor layer that is provided on the back-barrier layer, wherein, in the back-barrier layer, in a thickness direction, an In composition increases at a first interface with the first nitride semiconductor layer, and the In composition is continuously reduced toward a second interface with the second nitride semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

In the present embodiment, an InAlGaN/GaN HEMT will be described as a nitride semiconductor device.

Manufacturing Method 1

FIGS. 1A to 1D, FIGS. 2A to 2D, and FIGS. 3A to 3C are schematic sectional views illustrating a manufacturing method 1 for an InAlGaN/GaN HEMT according to the present embodiment in a process order.

Figure 1A:
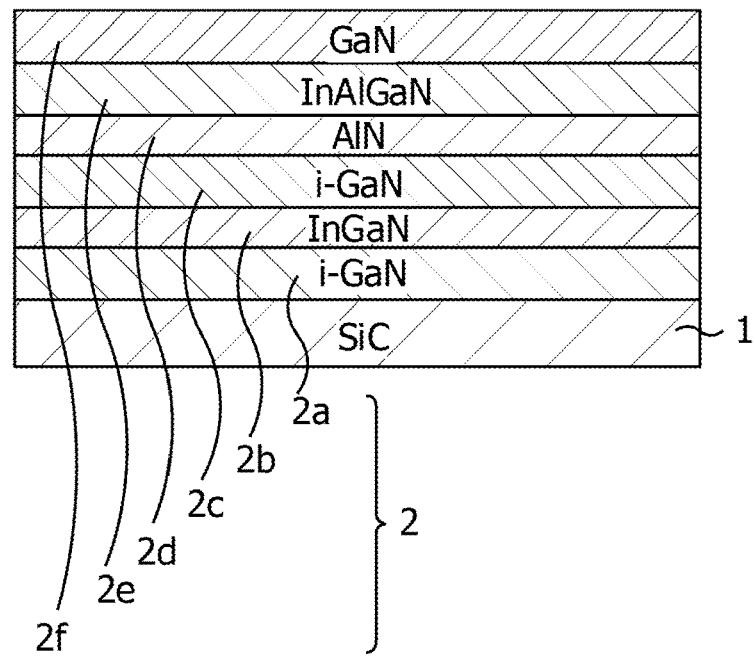
FIGS. 1A, 1B, 1C, and 1D are schematic sectional views illustrating a manufacturing method 1 for an InAlGaN/GaN HEMT according to a first embodiment in a process order.

First, as illustrated in FIG. 1A, a nitride semiconductor laminated structure 2 is formed on, for example, a SiC substrate 1 as a growth substrate. As the growth substrate, instead of the SiC substrate, a Si substrate, a sapphire substrate, a GaN substrate, or the like may be used. The substrate may be semi-insulating or conductive.

The nitride semiconductor laminated structure 2 is configured to include a buffer layer 2a, a back-barrier layer 2b, an electron transit layer 2c, an intermediate layer 2d, an electron supply layer (barrier layer) 2e, and a cap layer 2f.

In an epitaxial crystal for a completed InAlGaN/GaN HEMT, a two-dimensional electron gas (2DEG) is generated around an interface of the electron transit layer 2c with the electron supply layer 2e (more specifically, the intermediate layer 2d). The 2DEG is generated based on a polarization difference between a compound semiconductor (herein, GaN) of the electron transit layer 2c and a compound semiconductor (herein, InAlGaN) of the electron supply layer 2e.

Specifically, each of the following compound semiconductors grows on the SiC substrate 1 according to, for example, a metal organic vapor phase epitaxy (MOVPE) method. Instead of the MOVPE method, a molecular beam epitaxy (MBE) method may be used.

Intentionally undoped (i)-GaN at a thickness of approximately 2000 nm, InGaN at a thickness of 5 nm or less, for example, approximately 2 nm, i-GaN at a thickness of approximately 30 nm, AlN at a thickness of approximately 1 nm, n-InAlGaN at a thickness of approximately 10 nm, and n-GaN at a thickness of approximately 1 nm sequentially grow on the SiC substrate 1. Consequently, the buffer layer 2a, the back-barrier layer 2b, the electron transit layer 2c, the intermediate layer 2d, the electron supply layer 2e, and the cap layer 2f are formed. AlGaN or the like may be used to form the buffer layer 2a instead of GaN.

As a raw material gas of GaN forming the buffer layer 2a, the electron transit layer 2c, and the cap layer 2f, a mixed gas of a trimethyl gallium (TMG) gas and a $NH_3$ is used. As a raw material gas of InGaN forming the back-barrier layer 2b, a mixed gas of a trimethyl indium (TMI) gas, a TMG gas, and a $NH_3$ gas is used. As a raw material gas of AlN forming the intermediate layer 2d, a mixed gas of a trimethyl aluminum (TMA) gas and a $NH_3$ gas is used. As a raw material gas of InAlGaN forming the electron supply layer 2e, a mixed gas of a TMI gas, a TMA gas, a TMG gas, and a $NH_3$ gas is used. The supply of a TMG gas which is a Ga source, a TMI gas which is an In source, and a TMA gas which is an Al source and flow rates thereof are set as appropriate according to growing nitride semiconductor layers. A flow rate of an ammonia gas which is a common raw material is set to approximately 100 ccm to 10 LM. A growing pressure is set to approximately 50 Torr to 300 Torr, and a growing temperature is set to approximately 1000° C. to 1200° C.

In the present embodiment, in order to cause InGaN forming the back-barrier layer 2b to grow, a flow rate of a TMI gas is adjusted to provide such a composition gradient portion in which an In composition increases from 0% to the maximum value at an interface with the buffer layer 2a, and the In composition is continuously reduced toward an upper surface (an interface with the electron transit layer 2c when the electron transit layer 2c is formed), and becomes 0% at the upper surface. The maximum value of the In composition is set to, for example, approximately 10%.

When the back-barrier layer 2b is formed, preferably, a temperature is reduced right before the back-barrier layer 2b is formed, and a temperature is increased right after the back-barrier layer 2b is formed. Consequently, a lower surface and a partial upper part of an upper surface of the back-barrier layer 2b contain carbon (C), and thus a carbon concentration of the lower surface side is higher than that of the upper surface side. C forms an acceptor level, and may thus increase a low potential of a conduction band of the lower surface of the back-barrier layer 2b with a high carbon concentration. Thus, electron diffusion to the buffer layer 2a side is reduced, and thus there is an effect of suppressing a short channel effect and reducing a drain leakage current.

In order to cause InAlGaN forming the electron supply layer 2e and GaN forming the cap layer 2f to grow as an n type, for example, a $SiH_4$ gas containing, for example, Si as an n-type impurity is added to a raw material gas at a predetermined flow rate, and thus GaN and AlGaN is doped with Si. A doping concentration of Si is approximately $1\times10^{18}/cm^3$ to approximately $1\times10^{20}/cm^3$, for example, approximately $5\times10^{18}/cm^3$.

Figure 1B:
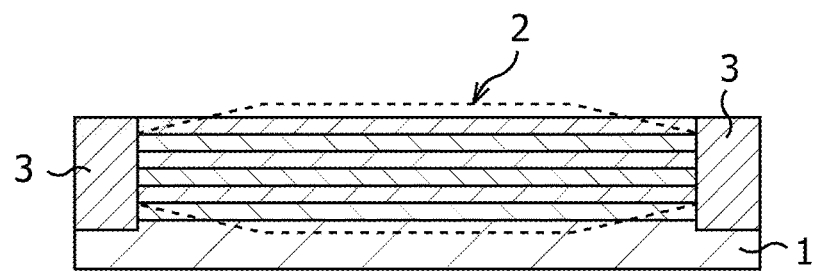

Next, as illustrated in FIG. 1B, element isolation regions 3 are formed.

Specifically, for example, argon (Ar) is injected into element isolation locations of the nitride semiconductor laminated structure 2. Consequently, the element isolation regions 3 are formed in the nitride semiconductor laminated structure 2 and a surface layer portion of the SiC substrate 1. An active region is defined on the nitride semiconductor laminated structure 2 by the element isolation regions 3.

Element isolation may be performed according to, for example, a shallow trench isolation (STI) method instead of the injection method. In this case, for example, a chlorine-based etching gas is used for dry etching of the nitride semiconductor laminated structure 2.

Figure 1C:
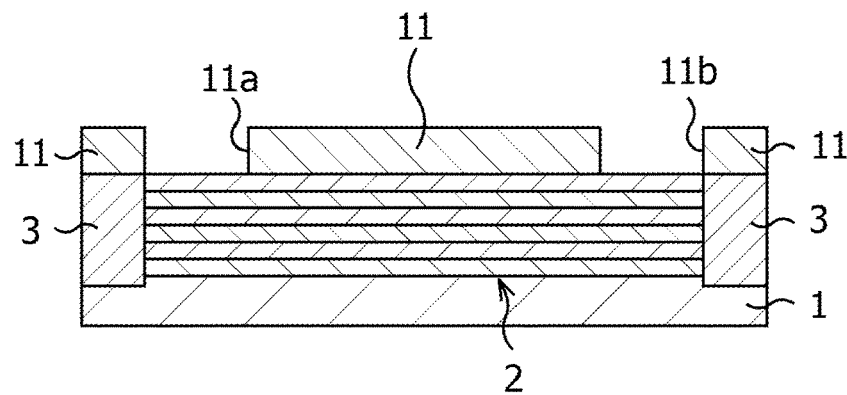

Next, as illustrated in FIG. 1C, a resist mask 11 is formed.

Specifically, a resist is coated on a surface of the nitride semiconductor laminated structure 2, and the resist is processed through lithography such that openings 11a and 11b to which the nitride semiconductor laminated structure 2 corresponding to locations where electrodes are scheduled to be formed is exposed are formed. Consequently, the resist mask 11 having the openings 11a and 11b is formed on the nitride semiconductor laminated structure 2.

Figure 1D:
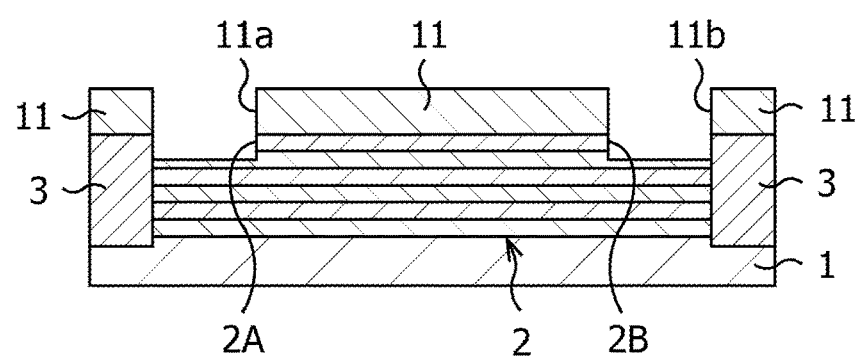

Next, as illustrated in FIG. 1D, electrode grooves 2A and 2B are formed at locations (electrode formation scheduled locations) where a source electrode and a drain electrode are scheduled to be formed on the surface of the nitride semiconductor laminated structure 2.

Specifically, the electrode formation scheduled locations are subjected to dry etching up to the middle of the electron supply layer 2e through the cap layer 2f by using the resist mask 11, so as to be removed. Consequently, the electrode grooves 2A and 2B to which the electrode formation scheduled locations on the surface of the electron supply layer 2e are exposed are formed. Regarding etching conditions, an inert gas such as Ar and a chlorine-based gas such as $Cl_2$ are used as etching gases, and, for example, $Cl_2$ is set to a flow rate of 30 sccm, a pressure of 2 Pa, and RF supply power of 20 W. The electrode grooves 2A and 2B may be etched to penetrate through the cap layer 2f and the electron supply layer 2e up to the middle of the intermediate layer 2d.

The resist mask is removed by a heated organic solvent.

Figure 2A:
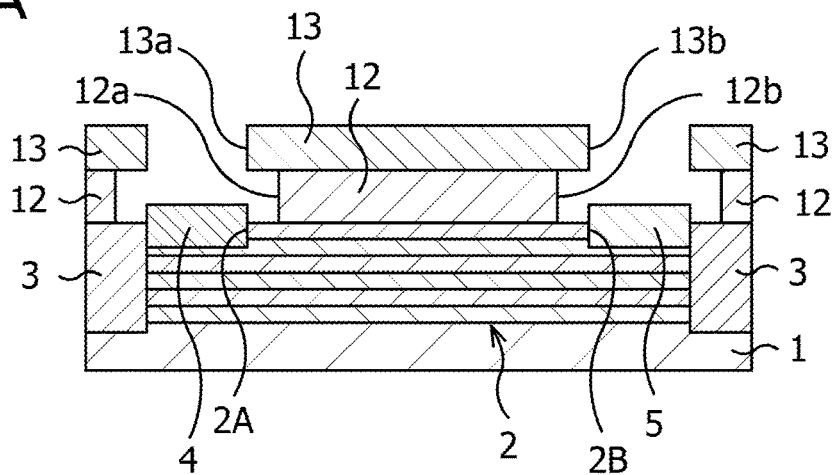
FIGS. 2A, 2B, 2C, and 2D are subsequent to FIG. 1D, and are schematic sectional views illustrating the manufacturing method 1 for the InAlGaN/GaN HEMT according to the first embodiment in a process order.

Next, as illustrated in FIG. 2A, a source electrode 4 and a drain electrode 5 are formed.

First, for example, two-layer resist masks having an eaves structure suitable for a deposition method and a lift-off method are formed on the nitride semiconductor laminated structure 2. Specifically, a resist mask 12 having openings 12a and 12b wider than the electrode grooves 2A and 2B and a resist mask 13 having openings 13a and 13b with a width equivalent to that of the electrode grooves 2A and 2B on the resist mask 12 are formed.

For example, Ti/Al as an electrode material is accumulated in the openings 12a and 13a to which the electrode grooves 2A and 2B are exposed and on the resist masks including the openings 12b and 13b according to, for example, a deposition method by using the resist masks 12 and 13. A thickness of Ti is approximately 20 nm, and a thickness of Al is approximately 200 nm. The resist masks 12 and 13 and Ti/Al accumulated thereon are removed according to a lift-off method. Thereafter, the SiC substrate 1 is subjected to heat treatment in, for example, a nitrogen atmosphere at a temperature of approximately 400° C. to 1000° C., for example, approximately 550° C., and thus remaining Ti/Al is subjected to ohmic contact with the electron supply layer 2e. The source electrode 4 and the drain electrode 5 in which the electrode grooves 2A and 2B are buried with parts of the electrode materials are formed.

Figure 2B:
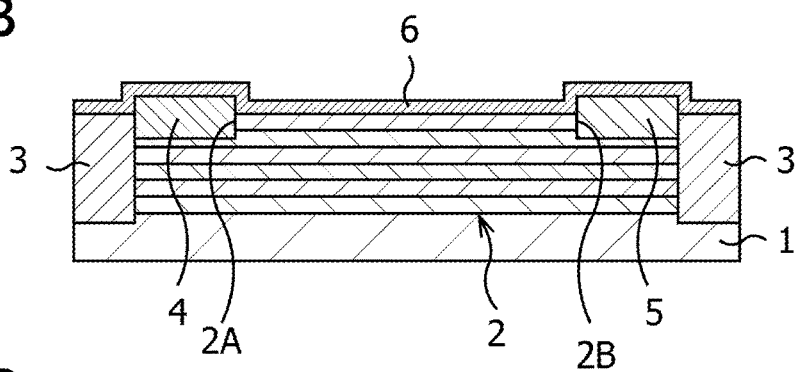

Next, as illustrated in FIG. 2B, a protection insulating film 6 is formed.

Specifically, for example, silicon nitride (SiN) is accumulated at a thickness of, for example, approximately 50 nm on the entire surface of the nitride semiconductor laminated structure 2 including the upper part of the source electrode 4 and the upper part of the drain electrode 5 by using a plasma CVD method or the like. A refractive index of SiN for light having a wavelength of 633 nm is approximately 2.0, and SiN is stoichiometric SiN. Through the above-described process, the protection insulating film 6 is formed.

Figure 2C:
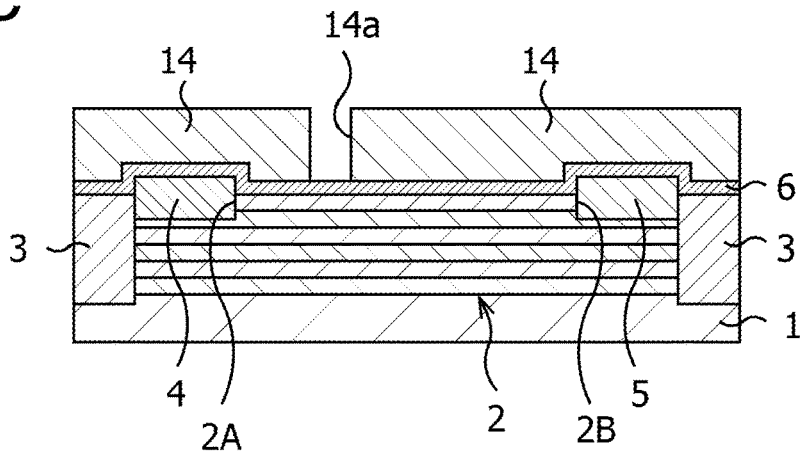

Next, as illustrated in FIG. 2C, a resist mask 14 is formed.

Specifically, an electron beam resist is coated on the entire surface of the protection insulating film 6 according to a spin coating method or the like. As the electron beam resist, for example, a resist which is a single layer and has the product name "PMGI" (manufactured by MicroChem Corporation of U.S.A.) is used. An electron beam is incident to the coated electron beam resist at a length of, for example, 0.1 μm in a current direction, so that the electron beam resist is exposed to light, and an opening 14a is formed through developing, and thus the resist mask 14 having the opening 14a is formed.

Figure 2D:
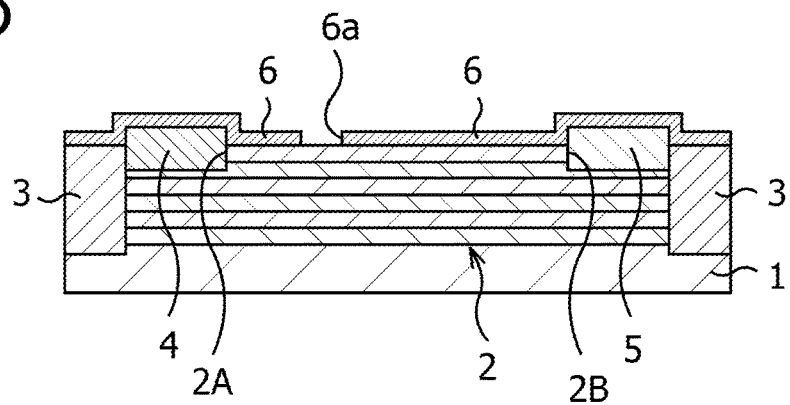

Next, as illustrated in FIG. 2D, an opening 6a is formed in the protection insulating film 6.

Specifically, the protection insulating film 6 is subjected to dry etching by using the resist mask 14 by using, for example, $SF_6$ as an etching gas. Through the above-described process, the opening 6a is formed in the protection insulating film 6.

Figure 3A:
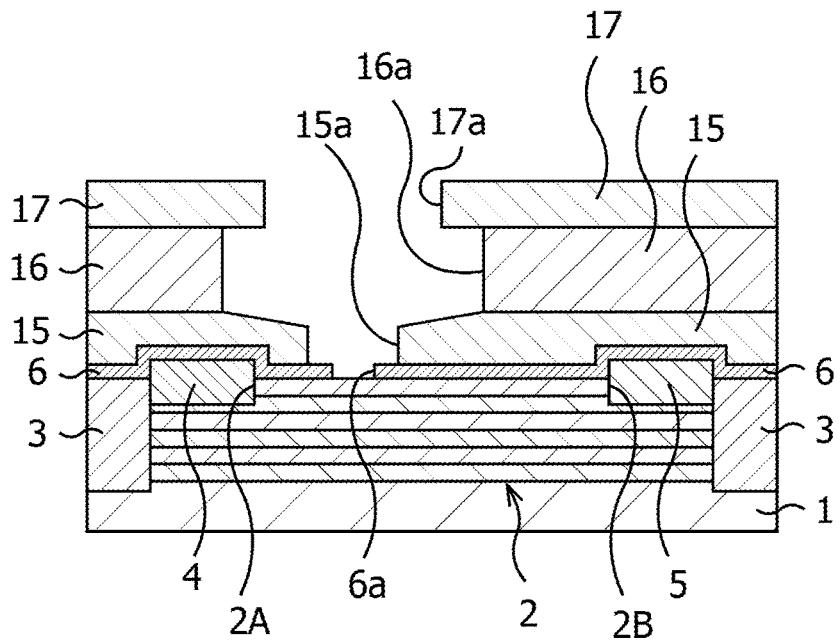
FIGS. 3A, 3B, and 3C are subsequent to FIG. 2D, and are schematic sectional views illustrating the manufacturing method 1 for the InAlGaN/GaN HEMT according to the first embodiment in a process order.

Next, as illustrated in FIG. 3A, resist masks 15, 16, 17 are formed.

Specifically, first, an electron beam resist is coated on the protection insulating film 6. The electron beam resist is formed of three layers, and the product name "PMMA" (manufactured by MicroChem Corporation of U.S.A.) is used for a lower layer resist, the product name "PMGI" (manufactured by MicroChem Corporation of U.S.A.) is used for an intermediate layer resist, and the product name "ZEP520" (manufactured by Zeon Corporation of Japan) is used for an upper layer resist. An electron beam is incident to a gate electrode formation scheduled region of the upper layer resist at a length of, for example, 0.8 μm in a current direction, so that the upper layer resist is exposed to light. After electron beam lithography, an opening having a length of, for example, 0.8 μm is formed in the upper layer resist by using, for example, the product name "ZEP-SD" (manufactured by Zeon Corporation of Japan) as a developer. The intermediate layer resist in a region which is set back from an opening end of the upper layer resist in an ohmic electrode direction by 0.5 μm is removed by using, for example, the product name "NMD-W" (manufactured by Tokyo Ohka Kogyo Co., Ltd.). Next, an electron beam is incident to an opening central part (including the opening 6a of the protection insulating film 6) of the upper layer resist and the intermediate layer resist at a length of, for example, 0.1 μm in a current direction, so that the opening central part is exposed to light. After electron beam lithography, an opening having a length of, for example, 0.15 μm which is wider than the opening 6a of the protection insulating film 6 is formed in the lower layer resist by using, for example, the product name "ZMD-B" (manufactured by Tokyo Ohka Kogyo Co., Ltd.) as a developer. Through the above-described process, the resist masks 15, 16, and 17 provided with openings 15a, 16a, and 17a are formed.

Figure 3B:
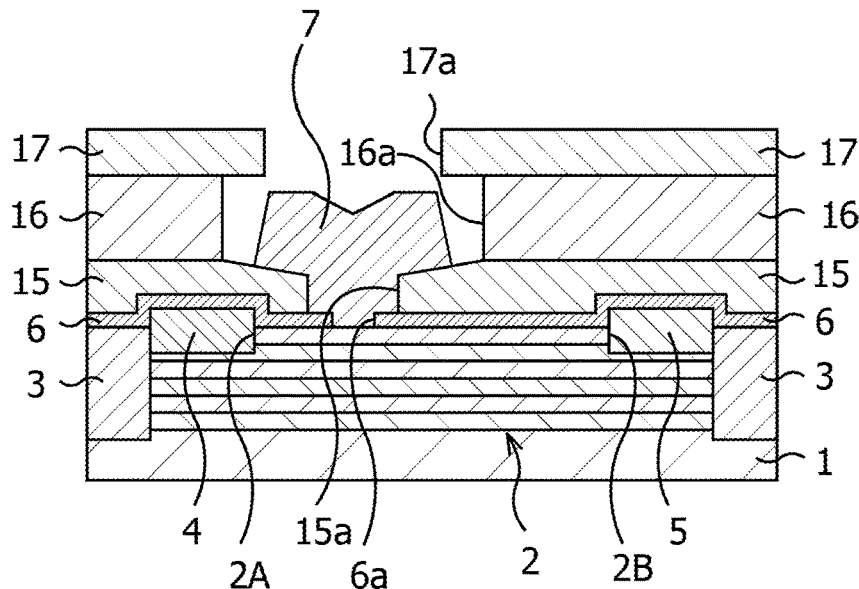

Next, as illustrated in FIG. 3B, a gate electrode 7 is formed.

Specifically, Ni/Au as an electrode material is accumulated on the resist mask 15 including the opening 6a in the openings 16a and 17a according to, for example, a deposition method by using the resist masks 15, 16, and 17. A thickness of Ni is approximately 10 nm, and a thickness of Au is approximately 300 nm. Through the above-described process, the gate electrode 7 in which the opening 6a is buried with a part of the electrode material is formed on the protection insulating film 6. The gate electrode 7 is integrally formed of a first portion burying the opening 6a of the protection insulating film 6, a second portion stranding on the protection insulating film 6 so as to be wider than the opening 6a, and a third portion wider than the second portion on the second portion.

Figure 3C:
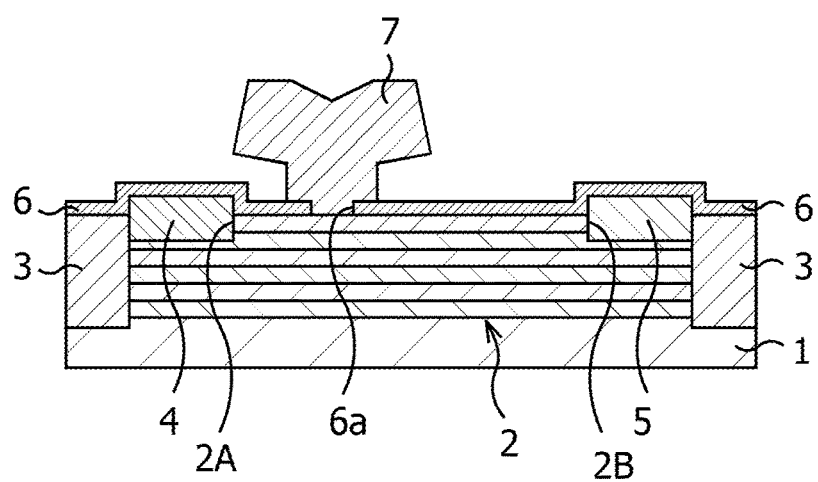

Next, as illustrated in FIG. 3C, the resist masks 15, 16, and 17 and Ni/Au (not illustrated) accumulated on the resist mask 17 are removed according to a lift-off method using a heated organic solvent.

Thereafter, the InAlGaN/GaN HEMT according to the present embodiment is formed through various processes of forming wirings connected to the source electrode 4, the drain electrode 5, and the gate electrode 7.

Manufacturing Method 2

Figure 4A:
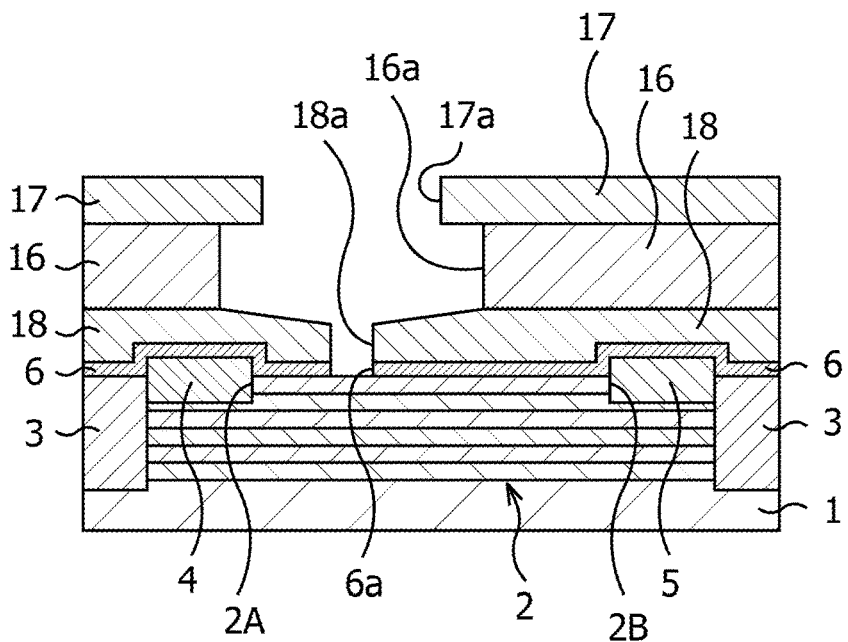
FIGS. 4A, 4B, and 4C are schematic sectional views illustrating principal processes of a manufacturing method 2 for an InAlGaN/GaN HEMT according to the first embodiment in order.
Figure 4B:
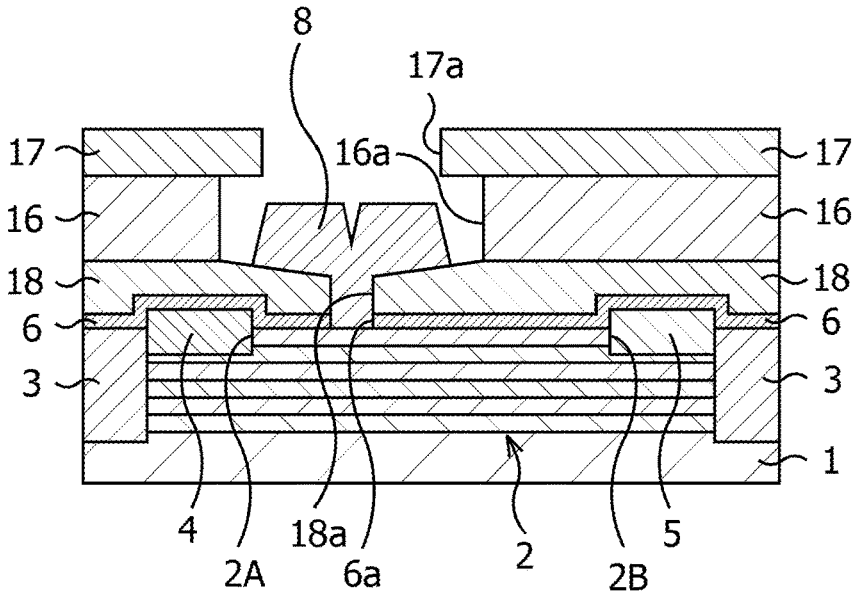
Figure 4C:
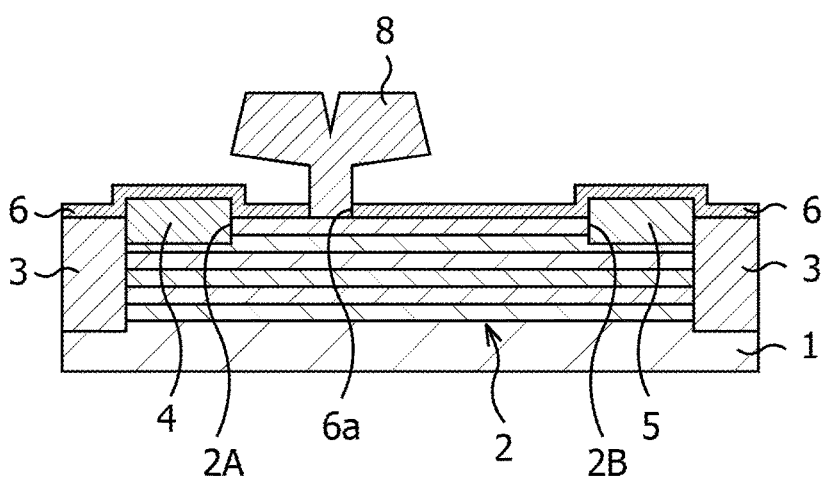

FIGS. 4A, 4B, and 4C are schematic sectional views illustrating principal processes of a manufacturing method 2 for an InAlGaN/GaN HEMT according to the first embodiment.

In a manufacturing method 2, in the same manner as in the manufacturing method 1, the respective processes in FIGS. 1A to 1D and FIGS. 2A to 2D are performed. In this case, the opening 6a is formed in the protection insulating film 6 on the nitride semiconductor laminated structure 2.

Next, as illustrated in FIG. 4A, resist masks 18, 16, and 17 are formed.

Specifically, first, an electron beam resist is coated on the protection insulating film 6. The electron beam resist is formed of three layers, and the product name "PMMA" (manufactured by MicroChem Corporation of U.S.A.) is used for a lower layer resist, the product name "PMGI" (manufactured by MicroChem Corporation of U.S.A.) is used for an intermediate layer resist, and the product name "ZEP520" (manufactured by Zeon Corporation of Japan) is used for an upper layer resist. An electron beam is incident to a gate electrode formation scheduled region of the upper layer resist at a length of, for example, 0.8 μm in a current direction, so that the upper layer resist is exposed to light. After electron beam lithography, an opening having a length of, for example, 0.8 μm is formed in the upper layer resist by using, for example, the product name "ZEP-SD" (manufactured by Zeon Corporation of Japan) as a developer. The intermediate layer resist in a region which is set back from an opening end of the upper layer resist in an ohmic electrode direction by 0.5 μm is removed by using, for example, the product name "NMD-W" (manufactured by Tokyo Ohka Kogyo Co., Ltd.). Next, an electron beam is incident to an opening central part (including the opening 6a of the protection insulating film 6) of the upper layer resist and the intermediate layer resist at a length of, for example, 0.1 μm in a current direction, so that the opening central part is exposed to light. After electron beam lithography, an opening having a length of, for example, 0.1 μm which is equivalent to that of the opening 6a of the protection insulating film 6 is formed in the lower layer resist by using, for example, the product name "ZMD-B" (manufactured by Tokyo Ohka Kogyo Co., Ltd.) as a developer. Through the processes, the resist masks 18, 16, and 17 provided with openings 18a, 16a, and 17a are formed.

Next, as illustrated in FIG. 4B, a gate electrode 8 is formed.

Specifically, Ni/Au as an electrode material is accumulated on the resist mask 18 including the opening 6a in the openings 16a and 17a according to, for example, a deposition method by using the resist masks 18, 16, and 17. A thickness of Ni is approximately 10 nm, and a thickness of Au is approximately 300 nm. Through the above-described process, the gate electrode 8 in which the opening 6a is buried with a part of the electrode material is formed on the protection insulating film 6. The gate electrode 8 is integrally formed of a first portion burying the opening 6a of the protection insulating film 6 and extending over the protection insulating film 6, and a second portion wider than the first portion thereon.

Next, as illustrated in FIG. 4C, the resist masks 18, 16, and 17 and Ni/Au (not illustrated) accumulated on the resist mask 17 are removed according to a lift-off method using a heated organic solvent.

Thereafter, the InAlGaN/GaN HEMT according to the present embodiment is formed through various processes of forming wirings connected to the source electrode 4, the drain electrode 5, and the gate electrode 8.

Hereinafter, an advantageous effect achieved by the InAlGaN/GaN HEMT according to the present embodiment will be described based on comparison with various comparative examples.

Comparative Example 1 corresponds to an InAlGaN/GaN HEMT not provided with a back-barrier layer.

Comparative Example 2 corresponds to an InAlGaN/GaN HEMT in which a back-barrier layer of InGaN is provided in inter-i-GaN (for example, between a buffer layer and an electron transit layer). In Comparative Example 2, the back-barrier layer has an In composition which increases stepwise (rapidly) at an interface with the buffer layer and an interface with the electron transit layer, the In composition being a substantially fixed value of 10% in a thickness direction between both of the interfaces.

Figure 5:
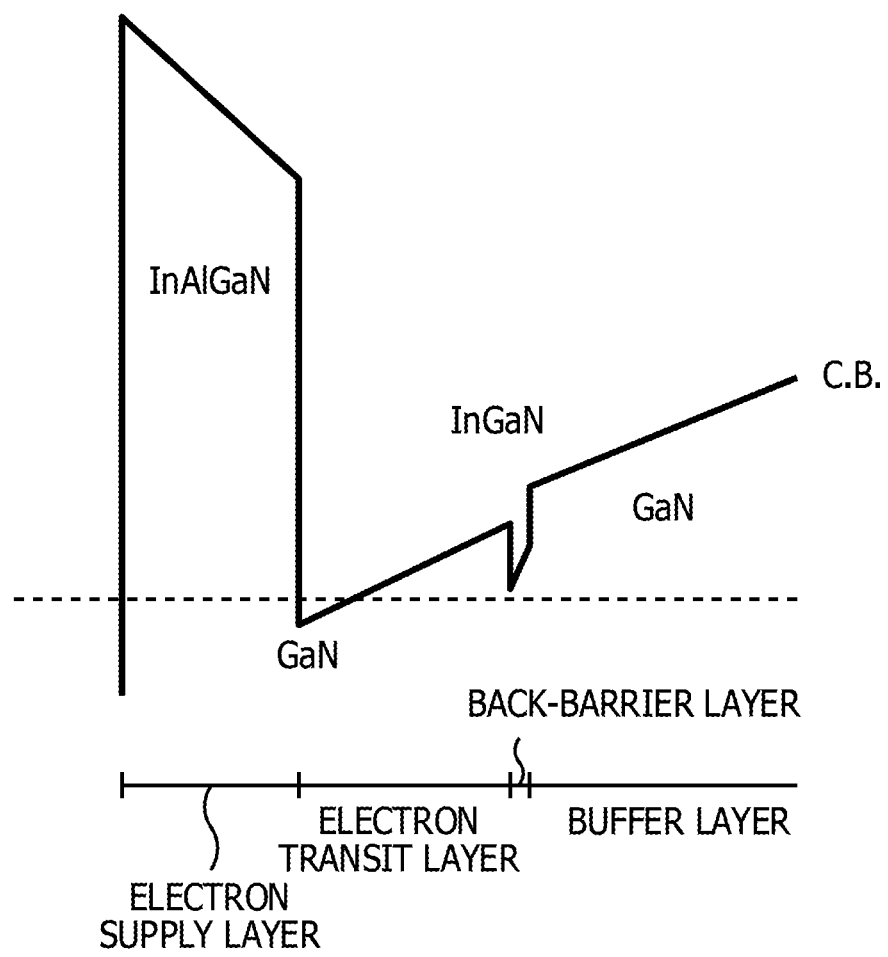
FIG. 5 is a characteristic diagram illustrating a band state of a conductor in an InAlGaN/GaN HEMT of Comparative Example 2.

FIG. 5 illustrates a band state of a conductor in the InAlGaN/GaN HEMT of Comparative Example 2. In this case, a barrier for an electron is formed due to the curvature of a conduction band caused by inverse piezoelectric charge, and discontinuity of conduction band potentials between i-GaN of the buffer layer and the electron transit layer and InGaN of the back-barrier layer.

Figure 6A:
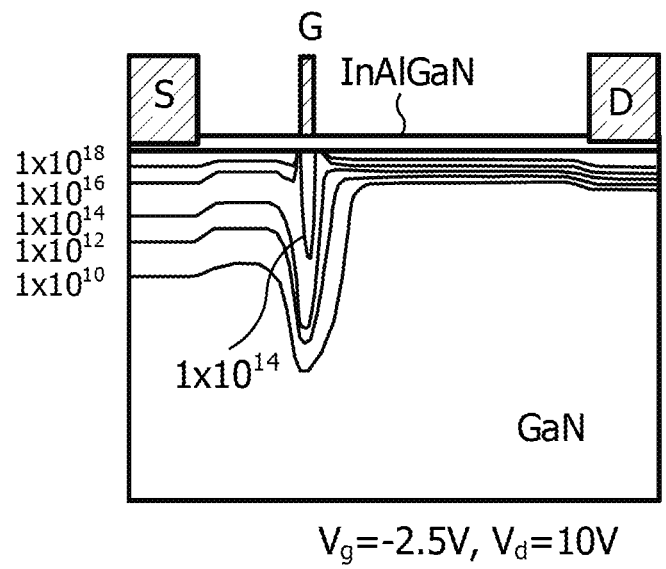
FIGS. 6A and 6B are simulation diagrams illustrating electron distributions in InAlGaN/GaN HEMTs of Comparative Examples 1 and 2.
Figure 6B:
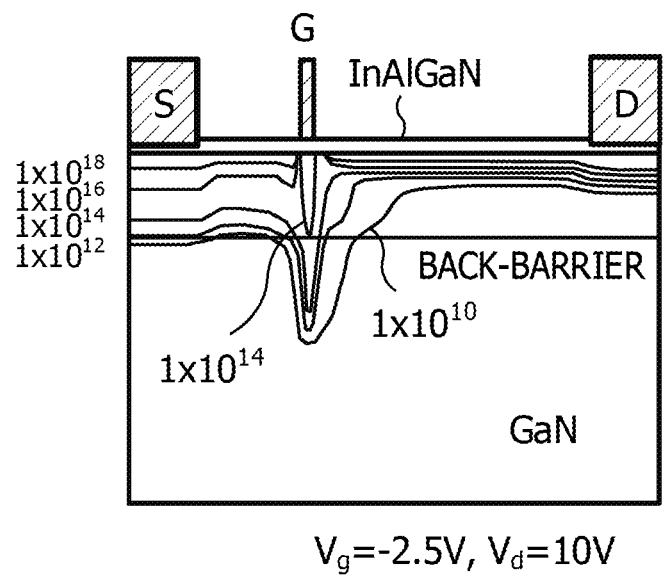

FIGS. 6A and 6B illustrate results of examining electron distributions of the InAlGaN/GaN HEMTs of Comparative Examples 1 and 2. FIG. 6A illustrates an electron distribution in Comparative Example 1, and FIG. 6B illustrates an electron distribution in Comparative Example 2. It may be seen that an electron concentration in the buffer layer or the electron transit layer is suppressed in Comparative Example 2 more than in Comparative Example 1.

However, it is understood that an electron is distributed at a high concentration even in the comparative example in which the back-barrier layer is provided. This is a cause to reduce a pinch-off characteristic of an InAlGaN/GaN HEMT. In Comparative Example 2, a barrier for an electron is formed due to the curvature of a conduction band caused by inverse piezoelectric charge of the back-barrier layer, and discontinuity of conduction band potentials between GaN of the buffer layer and the electron transit layer and InGaN of the back-barrier layer. In the present embodiment, the reason why an electron is distributed at a high concentration despite the barrier being formed is concluded to be that a sufficient confinement effect for the electron is not exhibited without an increase in a potential of the entire conduction band in the buffer layer or the electron transit layer.

Figure 7A:
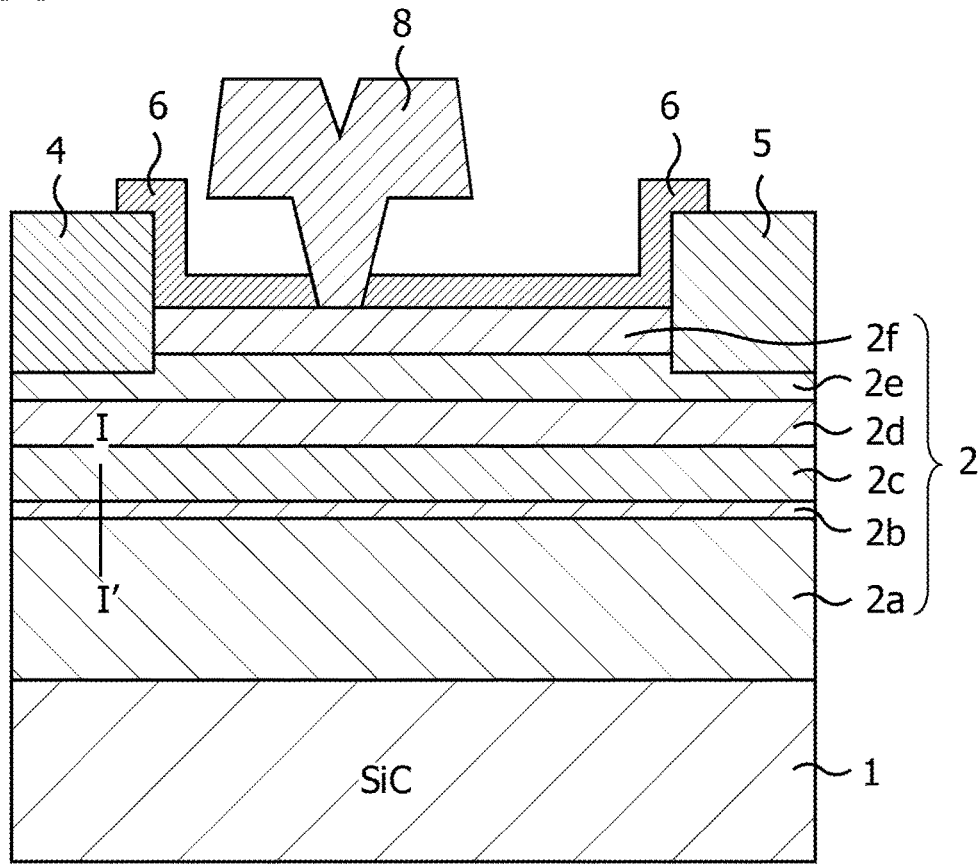
FIGS. 7A and 7B are schematic diagrams illustrating an In composition of a back-barrier layer along with a schematic configuration of the InAlGaN/GaN HEMT according to the first embodiment (manufacturing method 2)
Figure 7B:
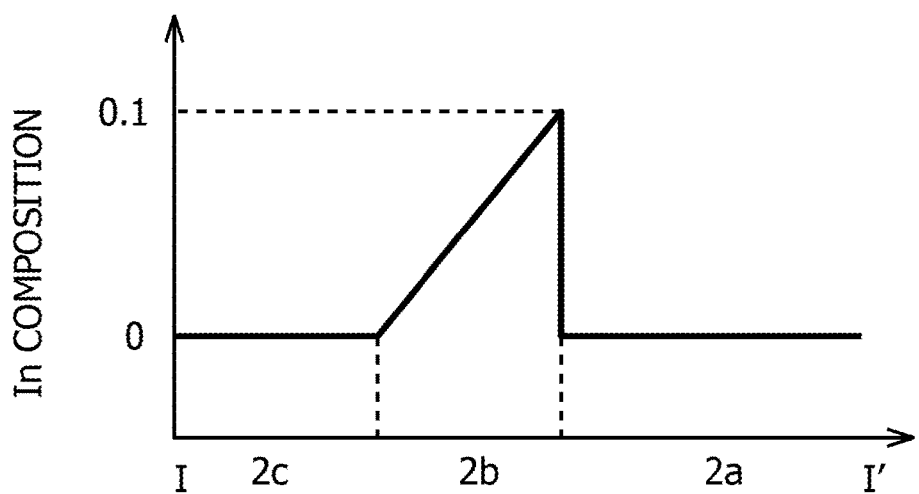

FIGS. 7A and 7B are schematic diagrams illustrating an In composition of a back-barrier layer along with a schematic configuration of the InAlGaN/GaN HEMT according to the present embodiment (manufacturing method 2). FIG. 7A illustrates a schematic configuration of the InAlGaN/GaN HEMT, and FIG. 7B illustrates an In composition of the back-barrier layer.

As illustrated in FIG. 7A, in the InAlGaN/GaN HEMT, the nitride semiconductor laminated structure 2 is provided with a negative charge layer (herein, the back-barrier layer 2b) having negative charge on a lower surface thereof in inter-i-GaN of the buffer layer (or the electron transit layer) under a 2DEG. A portion in contact with a lower surface of the negative charge layer and a portion in contact with an upper surface of the negative charge layer are made of an identical material (i-GaN in FIGS. 7A and 7B) having an identical composition proportion. For example, the InAlGaN/GaN HEMT has remaining negative charge as a result of negative charge and positive charge canceling out each other at a position into which the back-barrier layer 2b of InGaN is inserted. The presence of the negative charge may be checked according to a CV method or a microscopic EB method. The presence of the negative charge may be checked according to other methods.

In Comparative Example 2, negative fixed charge (spontaneous polarization charge and piezoelectric polarization charge) is generated in an interface of the back-barrier layer with the buffer layer, and positive fixed charge (spontaneous polarization charge and piezoelectric polarization charge) is generated in an interface of the back-barrier layer with the electron transit layer. Amounts of the negative fixed charge and the positive fixed charge are the same as each other, both thereof cancel out each other, and thus electric charge neutrality occurs.

In contrast, in the present embodiment, the back-barrier layer 2b has an In composition as illustrated in FIG. 7B. For example, in the thickness direction, the back-barrier layer 2b has a composition gradient portion in which the In composition increases from 0% to the maximum value (for example, 10%) at the interface with the buffer layer 2a, and the In composition is continuously reduced toward the interface with the electron transit layer 2c, and becomes 0% at the interface. In the back-barrier layer 2b, the In composition continuously (gradually) changes at the interface with the electron transit layer 2c, and thus part of the positive fixed charge is lost. Thus, in the back-barrier layer 2b, the electric charge neutrality between the interface with the electron transit layer 2c and the interface with the buffer layer 2a collapses, and, as a result, an amount of the negative fixed charge is excessive. A potential of a conduction band of i-GaN in the buffer layer 2a increases due to the negative fixed charge. Consequently, a sufficient confinement effect for an electron may be achieved, and thus suppression of a short channel effect is realized.

On the other hand, a general back-barrier layer has a large thickness such as 100 nm, and there is a problem in that current collapse increases due to the presence of the back-barrier layer. In the present embodiment, the back-barrier layer 2b has an In composition distribution as described above, and may generate a sufficient amount of negative fixed charge even though the back-barrier layer 2b is thinner than a general back-barrier layer. Thus, current collapse may be reduced. For example, the back-barrier layer 2b in the present embodiment has a thickness of approximately 5 nm. Consequently, a pinch-off characteristic is improved by the back-barrier layer 2b, and thus current collapse is alleviated. Regarding a mechanism of reducing current collapse, a thick back-barrier layer is used in the related art. In a case where, for example, AlGaN is used for a back-barrier layer, it is hard to reduce a trap in a crystal, and thus current collapse caused by the trap is problematic. The influence of the trap increases in proportion to a trap total amount (a product between a trap concentration and a trap thickness).

Figure 8A:
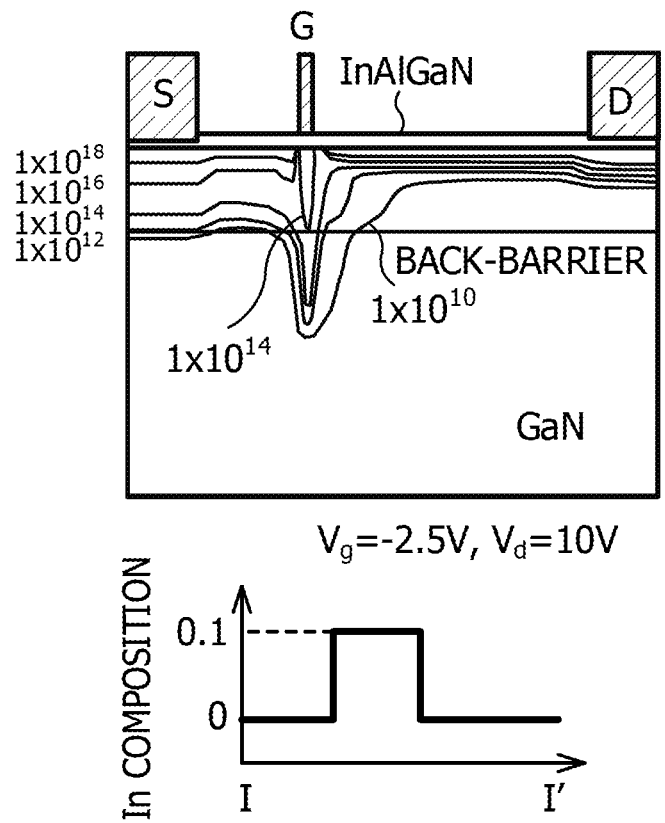
FIGS. 8A and 8B are schematic diagrams illustrating an electron distribution in the InAlGaN/GaN HEMT according to the first embodiment along with an electron distribution of Comparative Example 2.
Figure 8B:
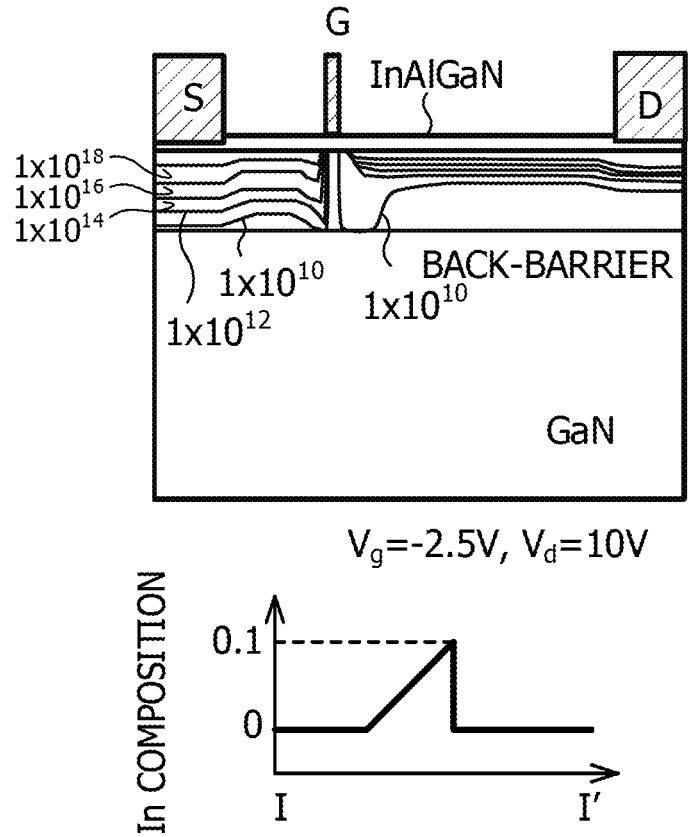

FIGS. 8A and 8B are schematic diagrams illustrating an electron distribution in the InAlGaN/GaN HEMT according to the present embodiment along with an electron distribution of Comparative Example 2. FIG. 8A illustrates Comparative Example 2, and FIG. 8B illustrates the present embodiment.

In Comparative Example 2, a high electron concentration region which is distributed to be bent directly under the gate electrode is recognized, but, in the present embodiment, it may be seen that formation of the electron concentration region is suppressed.

Figure 9:
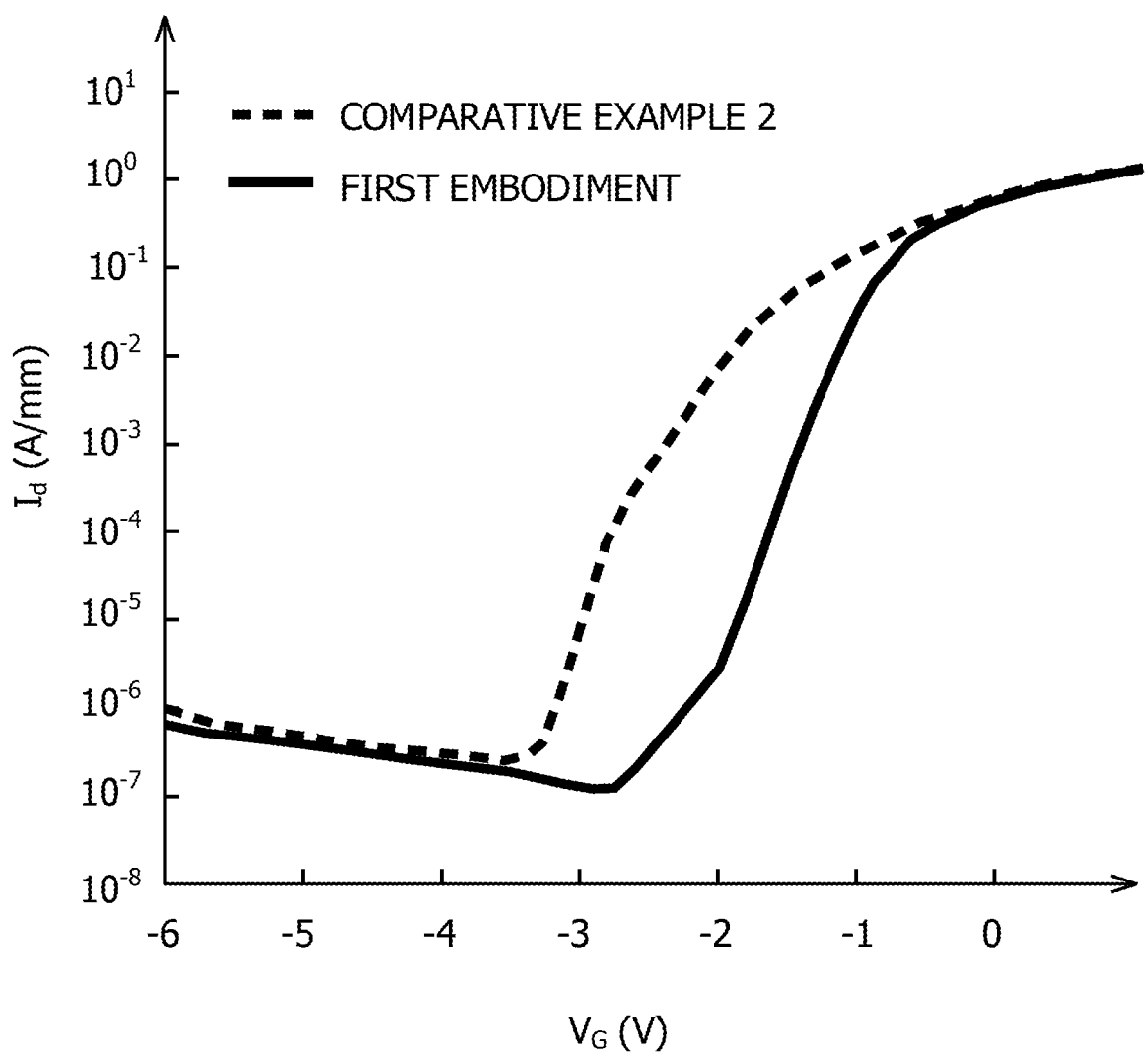
FIG. 9 is a characteristic diagram illustrating I-V characteristics of the InAlGaN/GaN HEMT according to the first embodiment along with I-V characteristics in Comparative Example 2.

FIG. 9 is a characteristic diagram illustrating I-V characteristics of the InAlGaN/GaN HEMT according to the present embodiment along with I-V characteristics in Comparative Example 2.

In the present embodiment, it may be clearly seen that a short channel effect is suppressed compared with the comparative example. As illustrated in FIG. 9, in the first embodiment, a threshold value returns to a positive side. The shift of the threshold value to the positive side suppresses a short channel effect, and achieves, for example, an effect of blocking the threshold value to the negative side.

Figure 10A:
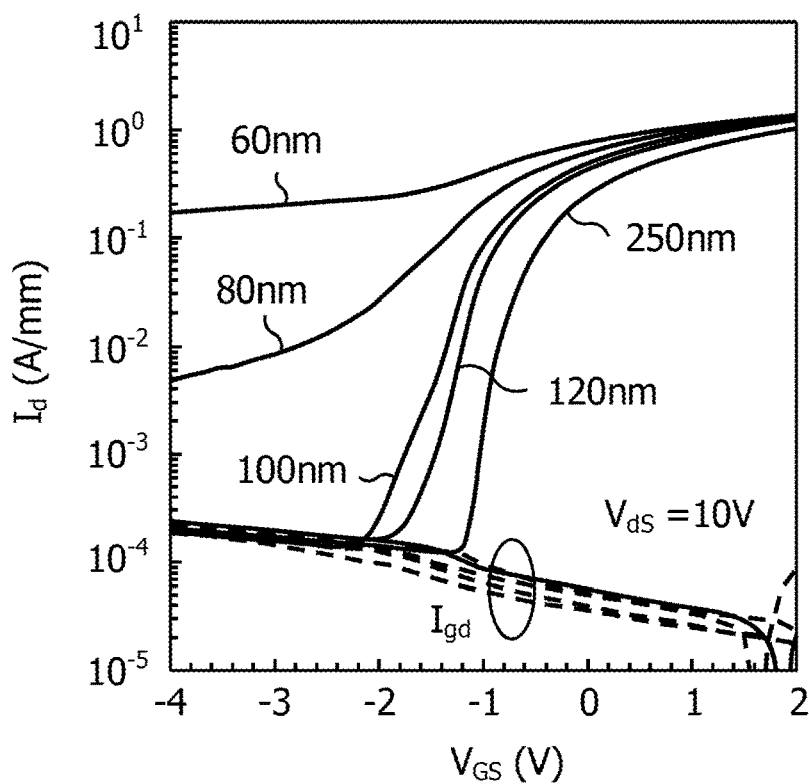
FIGS. 10A and 10B are characteristic diagrams illustrating I-V characteristics of the InAlGaN/GaN HEMT according to the first embodiment based on comparison with Comparative Example 2 in which a back-barrier layer is provided.
Figure 10B:
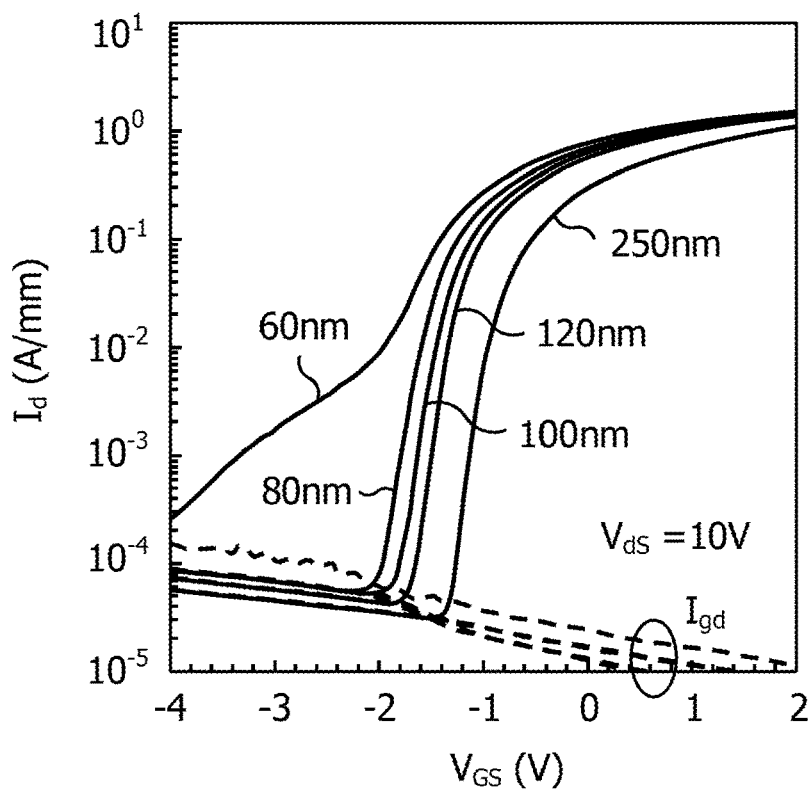

FIGS. 10A and 10B are characteristic diagrams illustrating I-V characteristics corresponding to different gate lengths in the InAlGaN/GaN HEMT according to the present embodiment based on comparison with Comparative Example 2 in which a back-barrier layer is provided. FIG. 10A illustrates Comparative Example 2, and FIG. 10B illustrates the present embodiment.

In the present embodiment, a short channel effect is suppressed compared with Comparative Example 2.

In the present embodiment, it is assumed that an In composition in the vicinity of the interface of the back-barrier layer 2b with the buffer layer 2a, for example, the maximum value of the In composition in the back-barrier layer 2b is 5% to 20%, for example, 10%. In a case where the maximum value is smaller than 5%, suppression of the short channel effect, for example, a drain leakage current reduction effect wears off, and, in a case where the maximum value is greater than 20%, carriers are induced in the back-barrier layer 2b and have conductivity. Therefore, the above range is preferable.

The back-barrier layer 2b contains carbon (C), and a lower surface side has a carbon concentration higher than that of an upper surface side. With this configuration, a conduction band potential of i-GaN of the buffer layer 2a is increased, and thus back-barrier property is improved.

The back-barrier layer 2b has an In composition which increases stepwise (rapidly) at an interface with the buffer layer 2a in a thickness direction, and is continuously reduced from the interface with the buffer layer 2a toward an interface with the electron transit layer 2c, and becomes 0% at the interface. With this configuration, the back-barrier layer 2b has a larger amount of negative charge in the interface with the buffer layer 2a than an amount of positive charge in the interface with the electron transit layer 2c by, for example, 10% or less. Consequently, a conduction band potential of i-GaN of the buffer layer 2a sufficiently increases, and this contributes to suppression of a short channel effect.

The back-barrier layer 2b is preferably located within a distance of approximately 40 nm from the upper surface of the electron transit layer 2c which is a hetero interface (for example, a thickness of the electron transit layer 2c is approximately 40 nm or less).

Figure 11:
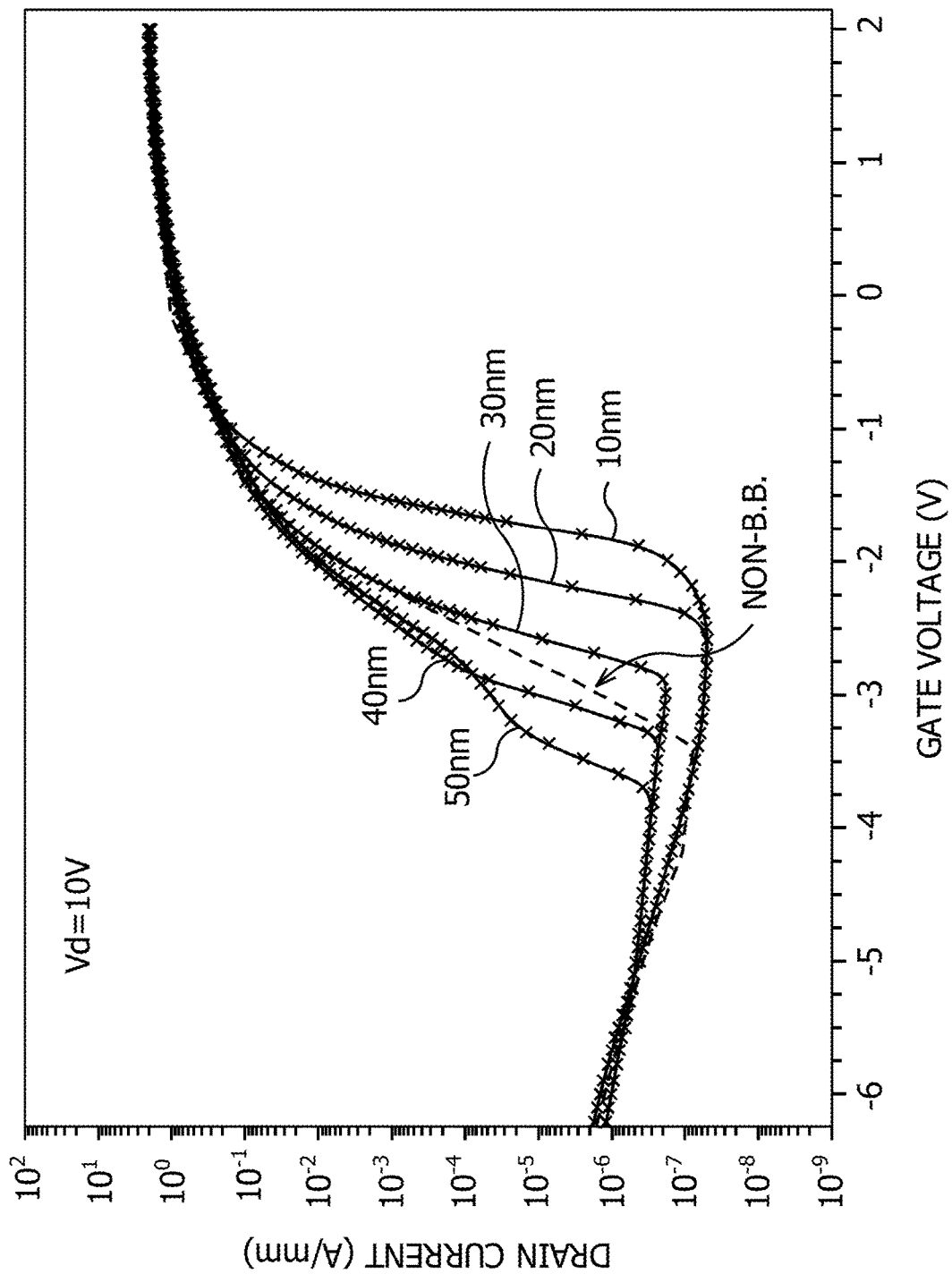
FIG. 11 is a characteristic diagram illustrating dependency of the back-barrier layer on a distance from a hetero interface in the I-V characteristics in the InAlGaN/GaN HEMT according to the first embodiment.

FIG. 11 is a characteristic diagram illustrating dependency of the back-barrier layer on a distance from an InAlGaN/GaN hetero interface in the I-V characteristics in the InAlGaN/GaN HEMT according to the present embodiment.

In this simulation, a principal region (sub-threshold slope) of a characteristic curve of when a drain current enters an ON state from an OFF state is focused, and slopes of characteristic curves corresponding to the different distances are compared with a slope in Comparative Example 1 (non-B.B.) in which a back-barrier layer is not provided. It may be seen that the slopes in the principal region of the characteristic curves corresponding to the distances of 10 nm to 40 nm are greater than the slope in the non-B.B., and a pinch-off characteristic higher than in the non-B.B. is obtained. In contrast, the slope of the characteristic curve corresponding to the distance of 50 nm is substantially the same as the slope in the non-B.B., and a pinch-off characteristic is not sufficient. The slope in I-V characteristics indicates a current/voltage gradient in a small current region of approximately $10^{-4}$ A/mm or less. The gradient indicates a voltage used to change a current value by one digit, and indicates channel controllability using a gate depletion layer. As the slope becomes larger, a device having more favorable switching characteristics or low power consumption property is obtained. Generally, the slope decreases in a case where a short channel effect is great, and a drain leakage current is large. The distance is preferably equal to or less than approximately 40 nm from the description.

As described above, according to the present embodiment, an InAlGaN/GaN HEMT having high reliability which realizes sufficient suppression of a short channel effect is implemented.

Figure 12:
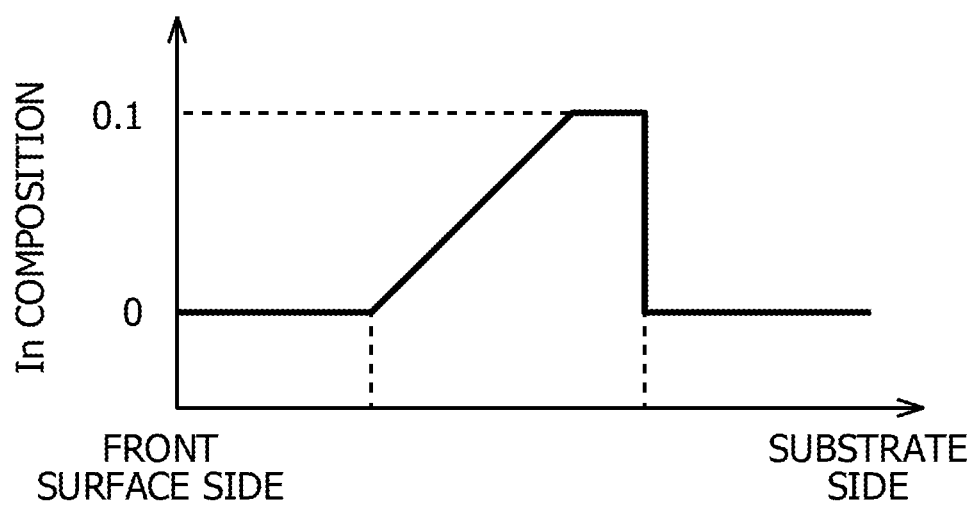
FIG. 12 is a characteristic diagram illustrating another example of an In composition of the InAlGaN/GaN HEMT according to the first embodiment.

In the present embodiment, the back-barrier layer 2b of InGaN may be formed to have an In composition including a portion where an In composition is uniform, for example, as illustrated in FIG. 12.

In this case, in order to cause InGaN forming the back-barrier layer 2b to grow, a flow rate of a TMI gas is adjusted to provide such a composition gradient portion in which an In composition increases from 0% to the maximum value at an interface with the buffer layer 2a, the maximum value is maintained for a predetermined time, and then the In composition is continuously reduced toward an upper surface (an interface with the electron transit layer 2c when the electron transit layer 2c is formed), and becomes 0% at the upper surface. The maximum value of the In composition is set to, for example, approximately 10%.

Consequently, the back-barrier layer 2b has the composition gradient portion in which the In composition increases to the maximum value (for example, 10%) from 0% at the interface with the buffer layer 2a in the thickness direction, the maximum value is maintained by a slight thickness, and the In composition is continuously reduced toward the interface with the electron transit layer 2c, and becomes 0% at the interface.

Even in this case, an electron distribution as illustrated in FIG. 8B is obtained, and formation of a high electron concentration region which is distributed to be bent directly under the gate electrode as illustrated in FIG. 8A is suppressed, and thus a short channel effect may be sufficiently suppressed.

Second Embodiment

In the present embodiment, an InAlGaN/GaN HEMT will be described as a nitride semiconductor device in the same manner as in the first embodiment, but there is a difference from the first embodiment in terms of a material of a back-barrier layer.

Manufacturing Method 1

FIGS. 13A to 13D, FIGS. 14A to 14D, and FIGS. 15A to 15C are schematic sectional views illustrating a manufacturing method 1 for an InAlGaN/GaN HEMT according to the present embodiment in a process order.

Figure 13A:
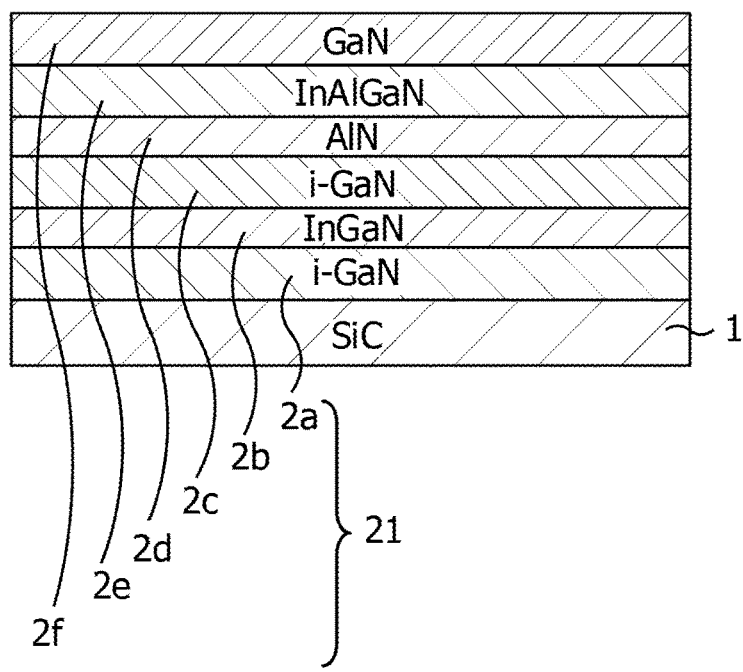
FIGS. 13A, 13B, 13C, and 13D are schematic sectional views illustrating a manufacturing method 1 for an InAlGaN/GaN HEMT according to a second embodiment in a process order.

First, as illustrated in FIG. 13A, a nitride semiconductor laminated structure 21 is formed on, for example, a SiC substrate 1 as a growth substrate. As the growth substrate, instead of the SiC substrate, a Si substrate, a sapphire substrate, a GaN substrate, or the like may be used. The substrate may be semi-insulating or conductive.

The nitride semiconductor laminated structure 21 is configured to include a buffer layer 2a, a back-barrier layer 22, an electron transit layer (barrier layer) 2c, an intermediate layer 2d, an electron supply layer 2e, and a cap layer 2f.

In a completed AlGaN/GaN HEMT, a two-dimensional electron gas (2DEG) is generated around an interface of the electron transit layer 2c with the electron supply layer 2e (more specifically, the intermediate layer 2d). The 2DEG is generated based on a polarization difference between a compound semiconductor (herein, GaN) of the electron transit layer 2c and a compound semiconductor (herein, InAlGaN) of the electron supply layer 2e.

Specifically, each of the following compound semiconductors grows on the SiC substrate 1 according to, for example, a metal organic vapor phase epitaxy (MOVPE) method. Instead of the MOVPE method, a molecular beam epitaxy (MBE) method may be used.

Intentionally undoped (i)-GaN at a thickness of approximately 2000 nm, AlGaN at a thickness of 5 nm or less, for example, approximately 2 nm, i-GaN at a thickness of approximately 30 nm, AlN at a thickness of approximately 1 nm, n-InAlGaN at a thickness of approximately 10 nm, and n-GaN at a thickness of approximately 1 nm sequentially grow on the SiC substrate 1. Consequently, the buffer layer 2a, the back-barrier layer 22, the electron transit layer 2c, the intermediate layer 2d, the electron supply layer 2e, and the cap layer 2f are formed. AlGaN or the like may be used to form the buffer layer 2a instead of GaN.

As a raw material gas of GaN forming the buffer layer 2a, the electron transit layer 2c, and the cap layer 2f, a mixed gas of a TMG gas and a $NH_3$ gas is used. As a raw material gas of AlGaN forming the back-barrier layer 22, a mixed gas of a TMA gas, a TMG gas, and a $NH_3$ gas is used. As a raw material gas of AlN forming the intermediate layer 2d, a mixed gas of a TMA gas and a $NH_3$ gas is used. As a raw material gas of InAlGaN forming the electron supply layer 2e, a mixed gas of a TMI gas, a TMA gas, a TMG gas, and a $NH_3$ gas is used. The supply of a TMG gas which is a Ga source, a TMI gas which is an In source, and a TMA gas which is an Al source and flow rates thereof are set as appropriate according to growing nitride semiconductor layers. A flow rate of an ammonia gas which is a common raw material is set to approximately 100 ccm to 10 LM. A growing pressure is set to approximately 50 Torr to 300 Torr, and a growing temperature is set to approximately 1000° C. to 1200° C.

In the present embodiment, in order to cause AlGaN forming the back-barrier layer 22 to grow, a flow rate of a TMA gas is adjusted such that an Al composition continuously increases from 0% to the maximum value at an interface with the buffer layer 2a toward an upper surface (an interface with the electron transit layer 2c when the electron transit layer 2c is formed) from an interface with the buffer layer 2a, and is reduced to 0% at the upper surface. The maximum value of the Al composition is set to, for example, approximately 30%.

When the nitride semiconductor laminated structure 21 is formed, preferably, a temperature is changed or a V-III ratio is adjusted. For example, a temperature is reduced right before a lower surface of the back-barrier layer 22 is formed, and a temperature is increased right after an upper surface of the back-barrier layer 22 is formed. Consequently, the back-barrier layer 22 contains carbon (C), and a carbon concentration of the lower surface side is higher than that of the upper surface side.

In order to cause InAlGaN forming the electron supply layer 2e and GaN forming the cap layer 2f to grow as an n type, for example, a $SiH_4$ gas containing, for example, Si as an n-type impurity is added to a raw material gas at a predetermined flow rate, and thus GaN and InAlGaN is doped with Si. A doping concentration of Si is approximately $1 \times 10^{18}/cm^3$ to approximately $1 \times 10^{20}/cm^3$, for example, approximately $5 \times 10^{18}/cm^3$.

Figure 13B:
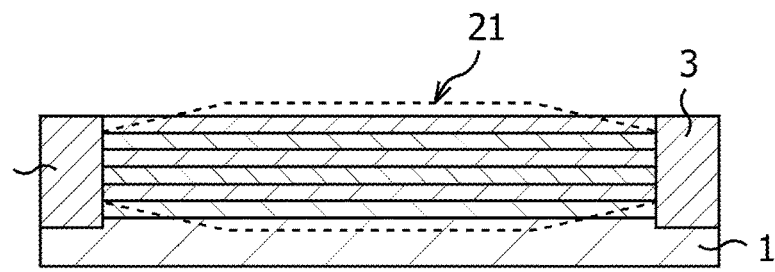

Next, as illustrated in FIG. 13B, element isolation regions 3 are formed.

Specifically, for example, argon (Ar) is injected into element isolation locations of the nitride semiconductor laminated structure 21. Consequently, the element isolation regions 3 are formed in the nitride semiconductor laminated structure 21 and a surface layer portion of the SiC substrate 1. An active region is defined on the nitride semiconductor laminated structure 21 by the element isolation regions 3.

Element isolation may be performed according to, for example, a shallow trench isolation (STI) method instead of the injection method. In this case, for example, a chlorine-based etching gas is used for dry etching of the nitride semiconductor laminated structure 21.

Figure 13C:
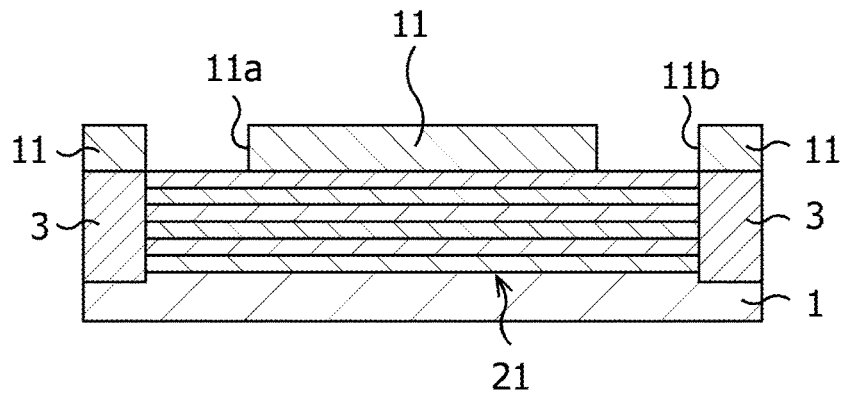

Next, as illustrated in FIG. 13C, a resist mask 11 is formed.

Specifically, a resist is coated on a surface of the nitride semiconductor laminated structure 21, and the resist is processed through lithography such that openings 11a and 11b to which the nitride semiconductor laminated structure 21 corresponding to locations where electrodes are scheduled to be formed is exposed are formed. Consequently, the resist mask 11 having the openings 11a and 11b is formed on the nitride semiconductor laminated structure 21.

Figure 13D:
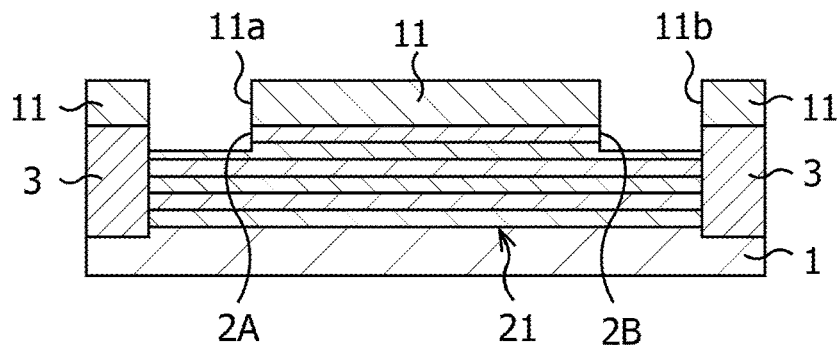

Next, as illustrated in FIG. 13D, electrode grooves 2A and 2B are formed at locations (electrode formation scheduled locations) where a source electrode and a drain electrode are scheduled to be formed on the surface of the nitride semiconductor laminated structure 21.

Specifically, the electrode formation scheduled locations are subjected to dry etching up to the middle of the electron supply layer 2e through the cap layer 2f by using the resist mask 11, so as to be removed. Consequently, the electrode grooves 2A and 2B to which the electrode formation scheduled locations on the surface of the electron supply layer 2e are exposed are formed. Regarding etching conditions, an inert gas such as Ar and a chlorine-based gas such as $Cl_2$ are used as etching gases, and, for example, $Cl_2$ is set to a flow rate of 30 sccm, a pressure of 2 Pa, and RF supply power of 20 W. The electrode grooves 2A and 2B may be etched to penetrate through the cap layer 2f and the electron supply layer 2e up to the middle of the intermediate layer 2d.

The resist mask is removed by a heated organic solvent.

Figure 14A:
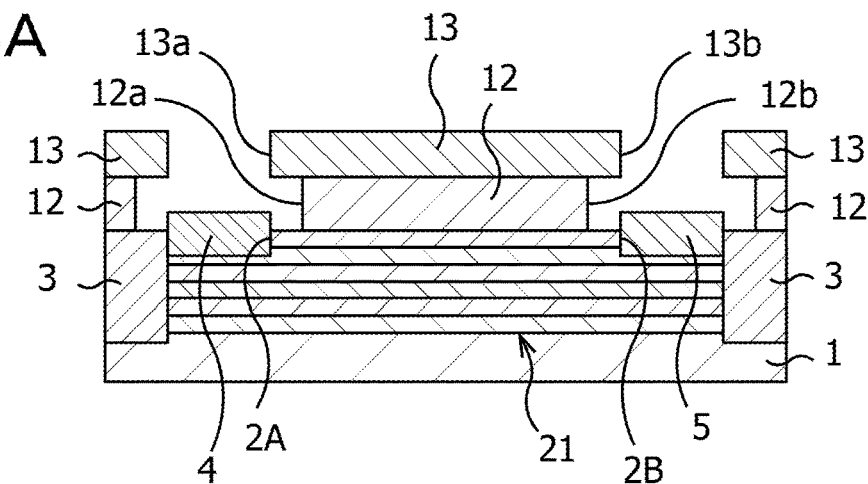
FIGS. 14A, 14B, 14C, and 14D are subsequent to FIG. 13D, and are schematic sectional views illustrating the manufacturing method 1 for the InAlGaN/GaN HEMT according to the second embodiment in a process order.

Next, as illustrated in FIG. 14A, a source electrode 4 and a drain electrode 5 are formed.

First, for example, two-layer resist masks having an eaves structure suitable for a deposition method and a lift-off method are formed on the nitride semiconductor laminated structure 21. Specifically, a resist mask 12 having openings 12a and 12b wider than the electrode grooves 2A and 2B and a resist mask 13 having openings 13a and 13b with a width equivalent to that of the electrode grooves 2A and 2B on the resist mask 12 are formed.

For example, Ti/Al as an electrode material is accumulated in the openings 12a and 13a to which the electrode grooves 2A and 2B are exposed and on the resist masks including the openings 12b and 13b according to, for example, a deposition method by using the resist masks 12 and 13. A thickness of Ti is approximately 20 nm, and a thickness of Al is approximately 200 nm. The resist masks 12 and 13 and Ti/Al accumulated thereon are removed according to a lift-off method. Thereafter, the SiC substrate 1 is subjected to heat treatment in, for example, a nitrogen atmosphere at a temperature of approximately 400° C. to 1000° C., for example, approximately 550° C., and thus remaining Ti/Al is subjected to ohmic contact with the electron supply layer 2e. The source electrode 4 and the drain electrode 5 in which the electrode grooves 2A and 2B are buried with parts of the electrode materials are formed.

Figure 14B:
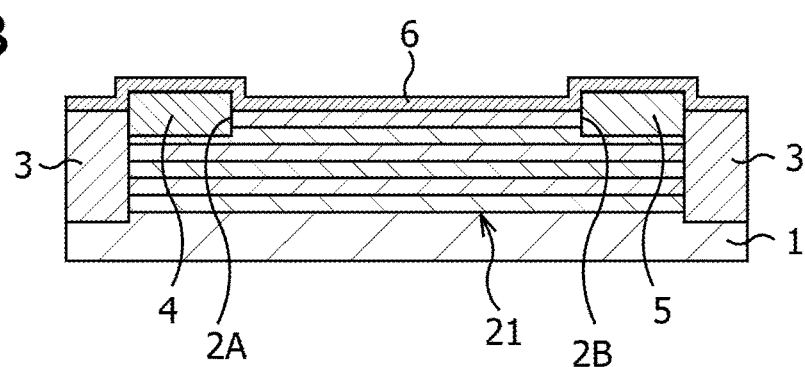

Next, as illustrated in FIG. 14B, a protection insulating film 6 is formed.

Specifically, for example, silicon nitride (SiN) is accumulated at a thickness of, for example, approximately 50 nm on the entire surface of the nitride semiconductor laminated structure 21 including the upper part of the source electrode 4 and the upper part of the drain electrode 5 by using a plasma CVD method or the like. A refractive index of SiN for light having a wavelength of 633 nm is approximately 2.0, and SiN is stoichiometric SiN. Through the above-described process, the protection insulating film 6 is formed.

Figure 14C:
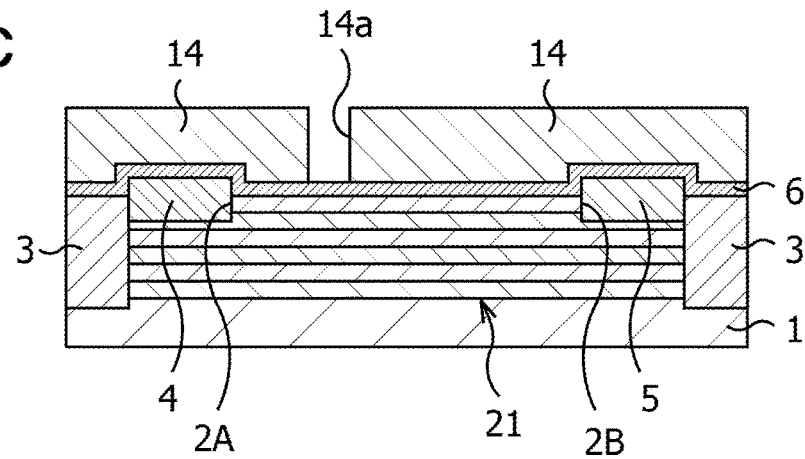

Next, as illustrated in FIG. 14C, a resist mask 14 is formed.

Specifically, an electron beam resist is coated on the entire surface of the protection insulating film 6 according to a spin coating method or the like. As the electron beam resist, for example, a resist which is a single layer and has the product name "PMGI" (manufactured by MicroChem Corporation of U.S.A.) is used. An electron beam is incident to the coated electron beam resist at a length of, for example, 0.1 μm in a current direction, so that the electron beam resist is exposed to light, and an opening 14a is formed through developing. Through the above-described process, the resist mask 14 having the opening 14a is formed.

Figure 14D:
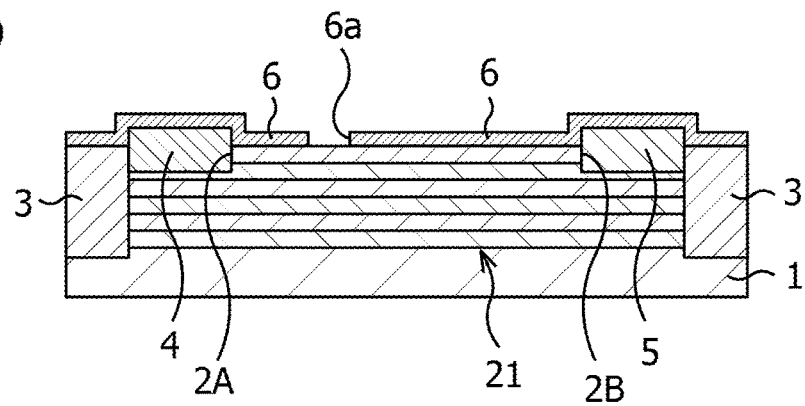

Next, as illustrated in FIG. 14D, an opening 6a is formed in the protection insulating film 6.

Specifically, the protection insulating film 6 is subjected to dry etching by using the resist mask 14 by using, for example, $SF_6$ as an etching gas. Through the above-described process, the opening 6a is formed in the protection insulating film 6.

Figure 15A:
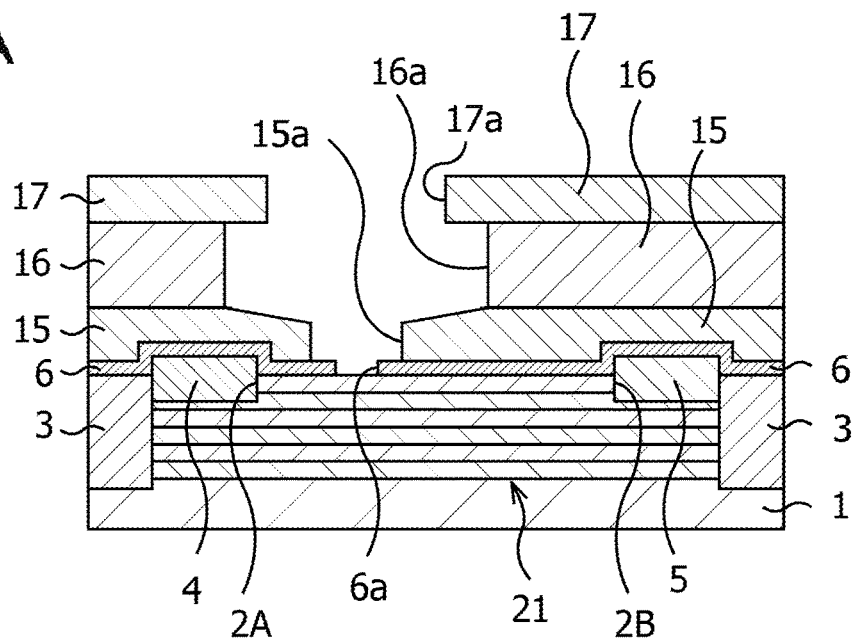
FIGS. 15A, 15B, and 15C are subsequent to FIG. 14D, and are schematic sectional views illustrating the manufacturing method 1 for the InAlGaN/GaN HEMT according to the second embodiment in a process order.

Next, as illustrated in FIG. 15A, resist masks 15, 16, 17 are formed.

Specifically, first, an electron beam resist is coated on the protection insulating film 6. The electron beam resist is formed of three layers, and the product name "PMMA" (manufactured by MicroChem Corporation of U.S.A.) is used for a lower layer resist, the product name "PMGI" (manufactured by MicroChem Corporation of U.S.A.) is used for an intermediate layer resist, and the product name "ZEP520" (manufactured by Zeon Corporation of Japan) is used for an upper layer resist. An electron beam is incident to a gate electrode formation scheduled region of the upper layer resist at a length of, for example, 0.8 µm in a current direction, so that the upper layer resist is exposed to light. After electron beam lithography, an opening having a length of, for example, 0.8 µm is formed in the upper layer resist by using, for example, the product name "ZEP-SD" (manufactured by Zeon Corporation of Japan) as a developer. The intermediate layer resist in a region which is set back from an opening end of the upper layer resist in an ohmic electrode direction by 0.5 µm is removed by using, for example, the product name "NMD-W" (manufactured by Tokyo Ohka Kogyo Co., Ltd.). Next, an electron beam is incident to an opening central part (including the opening 6a of the protection insulating film 6) of the upper layer resist and the intermediate layer resist at a length of, for example, 0.15 µm in a current direction, so that the opening central part is exposed to light. After electron beam lithography, an opening having a length of, for example, 0.15 µm which is wider than the opening 6a of the protection insulating film 6 is formed in the lower layer resist by using, for example, the product name "ZMD-B" (manufactured by Tokyo Ohka Kogyo Co., Ltd.) as a developer. Through the above-described processes, the resist masks 15, 16, and 17 provided with openings 15a, 16a, and 17a are formed.

Figure 15B:
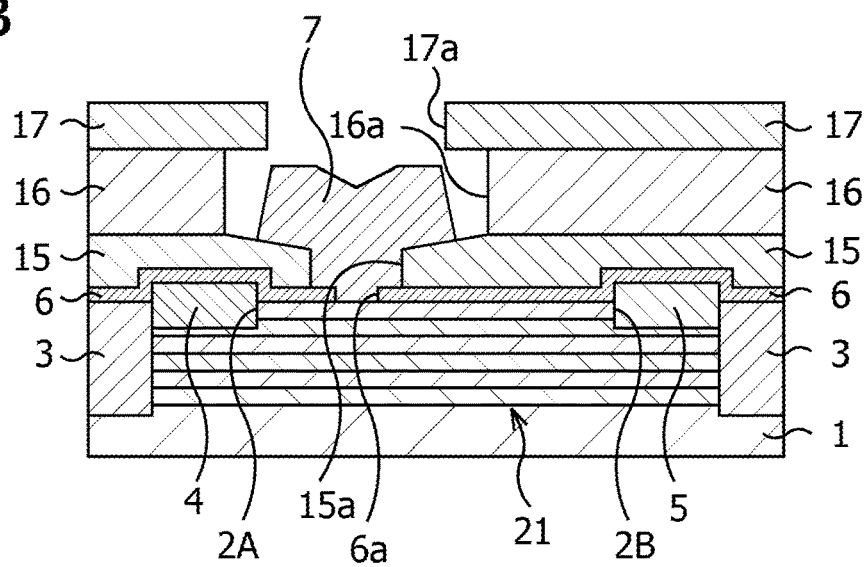

Next, as illustrated in FIG. 15B, a gate electrode 7 is formed.

Specifically, for example, Ni/Au as an electrode material is accumulated on the resist mask 15 including the opening 6a in the openings 16a and 17a according to, for example, a deposition method by using the resist masks 15, 16, and 17. A thickness of Ni is approximately 10 nm, and a thickness of Au is approximately 300 nm. Through the above-described process, the gate electrode 7 in which the opening 6a is buried with a part of the electrode material is formed on the protection insulating film 6. The gate electrode 7 is integrally formed of a first portion burying the opening 6a of the protection insulating film 6, a second portion stranding on the protection insulating film 6 so as to be wider than the opening 6a, and a third portion wider than the second portion on the second portion.

Figure 15C:
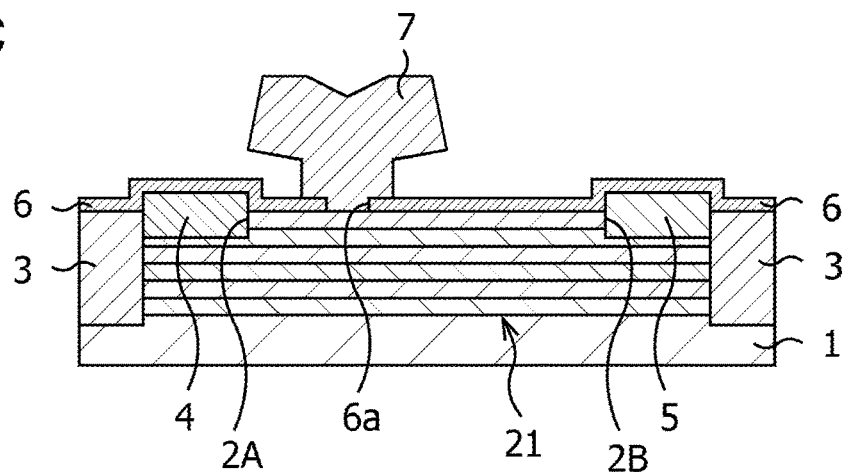

Next, as illustrated in FIG. 15C, the resist masks 15, 16, and 17 and Ni/Au (not illustrated) accumulated on the resist mask 17 are removed according to a lift-off method using a heated organic solvent.

Thereafter, the InAlGaN/GaN HEMT according to the present embodiment is formed through various processes of forming wirings connected to the source electrode 4, the drain electrode 5, and the gate electrode 7.

Manufacturing Method 2

Figure 16A:
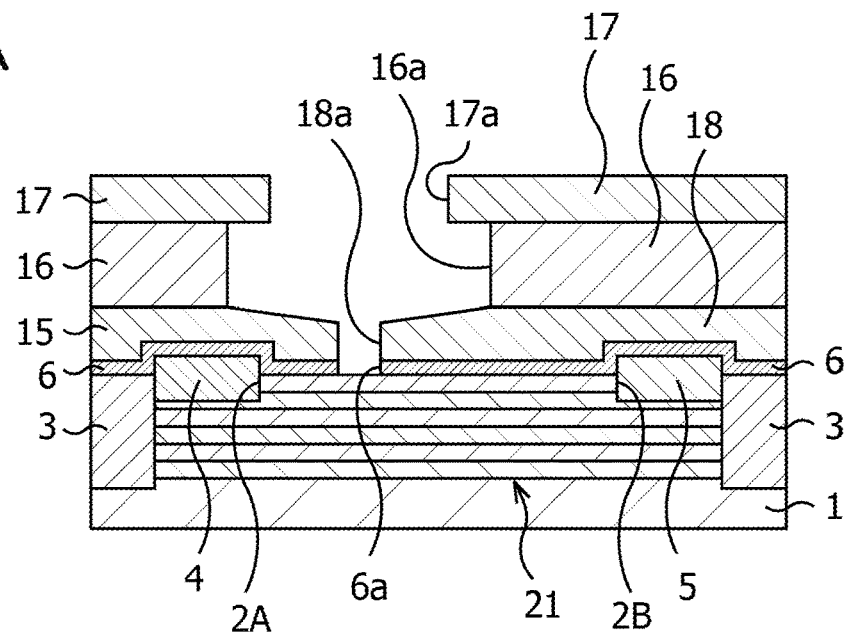
FIGS. 16A, 16B, and 16C are schematic sectional views illustrating principal processes of a manufacturing method 2 for an InAlGaN/GaN HEMT according to the second embodiment.
Figure 16B:
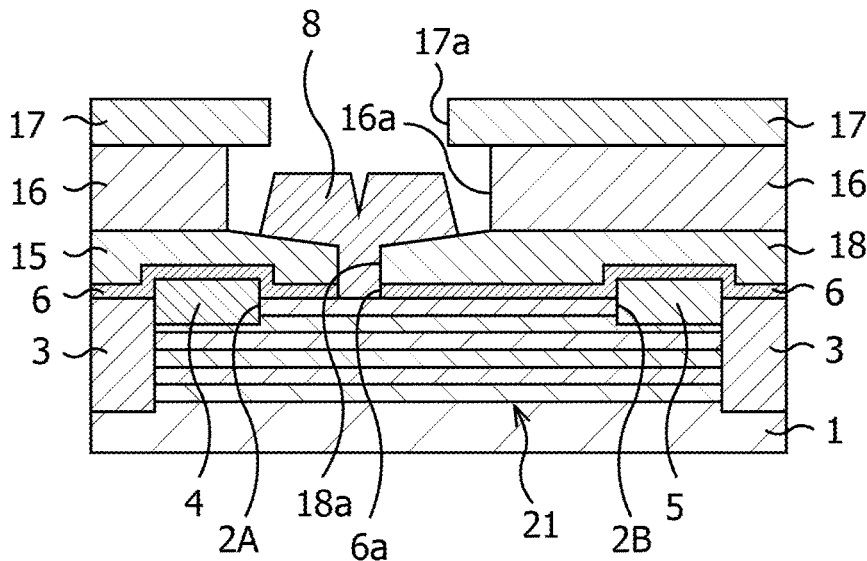
Figure 16C:
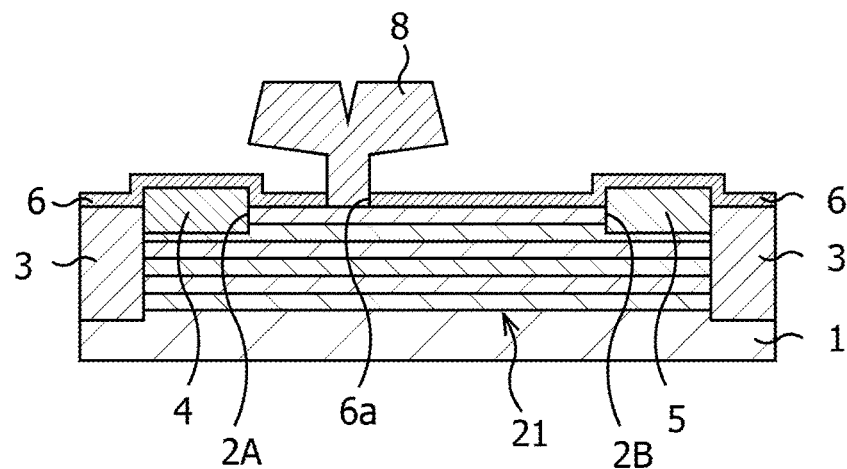

FIGS. 16A, 16B, and 16C are schematic sectional views illustrating principal processes of a manufacturing method 2 for an InAlGaN/GaN HEMT according to the present embodiment.

In a manufacturing method 2, in the same manner as in the manufacturing method 1, the respective processes in FIGS. 13A to 13D and FIGS. 14A to 14D are performed. In this case, the opening 6a is formed in the protection insulating film 6 on the nitride semiconductor laminated structure 21.

Next, as illustrated in FIG. 16A, resist masks 18, 16, and 17 are formed.

Specifically, first, an electron beam resist is coated on the protection insulating film 6. The electron beam resist is formed of three layers, and the product name "PMMA" (manufactured by MicroChem Corporation of U.S.A.) is used for a lower layer resist, the product name "PMGI" (manufactured by MicroChem Corporation of U.S.A.) is used for an intermediate layer resist, and the product name "ZEP520" (manufactured by Zeon Corporation of Japan) is used for an upper layer resist. An electron beam is incident to a gate electrode formation scheduled region of the upper layer resist at a length of, for example, 0.8 µm in a current direction, so that the upper layer resist is exposed to light. After electron beam lithography, for example, an opening having a length of, for example, 0.8 µm is formed in the upper layer resist by using, for example, the product name "ZEP-SD" (manufactured by Zeon Corporation of Japan) as a developer. The intermediate layer resist in a region which is set back from an opening end of the upper layer resist in an ohmic electrode direction by 0.5 µm is removed by using, for example, the product name "NMD-W" (manufactured by Tokyo Ohka Kogyo Co., Ltd.). Next, an electron beam is incident to an opening central part (including the opening 6a of the protection insulating film 6) of the upper layer resist and the intermediate layer resist at a length of, for example, 0.1 µm in a current direction, so that the opening central part is exposed to light. After electron beam lithography, for example, an opening having a length of, for example, 0.1 µm which is equivalent to that of the opening 6a of the protection insulating film 6 is formed in the lower layer resist by using, for example, the product name "ZMD-B" (manufactured by Tokyo Ohka Kogyo Co., Ltd.) as a developer. Through the processes, the resist masks 18, 16, and 17 provided with openings 18a, 16a, and 17a are formed.

Next, as illustrated in FIG. 16B, a gate electrode 8 is formed.

Specifically, Ni/Au as an electrode material is accumulated on the resist mask 18 including the opening 6a in the openings 16a and 17a according to, for example, a deposition method by using the resist masks 18, 16, and 17. A thickness of Ni is approximately 10 nm, and a thickness of Au is approximately 300 nm. Through the above-described process, the gate electrode 8 in which the opening 6a is buried with a part of the electrode material is formed on the protection insulating film 6. The gate electrode 8 is integrally formed of a first portion burying the opening 6a of the protection insulating film 6 and extending over the protection insulating film 6, and a second portion wider than the first portion thereon.

Next, as illustrated in FIG. 16C, the resist masks 18, 16, and 17 and Ni/Au (not illustrated) accumulated on the resist mask 17 are removed according to a lift-off method using a heated organic solvent.

Thereafter, the InAlGaN/GaN HEMT according to the present embodiment is formed through various processes of forming wirings connected to the source electrode 4, the drain electrode 5, and the gate electrode 8.

Hereinafter, an advantageous effect achieved by the InAlGaN/GaN HEMT according to the present embodiment will be described based on comparison with a comparative example.

The comparative example corresponds to an InAlGaN/GaN HEMT in which a back-barrier layer of AlGaN is provided in inter-i-GaN (for example, between a buffer layer and an electron transit layer). In the comparative example, the back-barrier layer has an Al composition which increases stepwise (rapidly) at an interface with the buffer layer and an interface with the electron transit layer, the Al composition being a substantially fixed value of 30% in a thickness direction between both of the interfaces.

Figure 17:
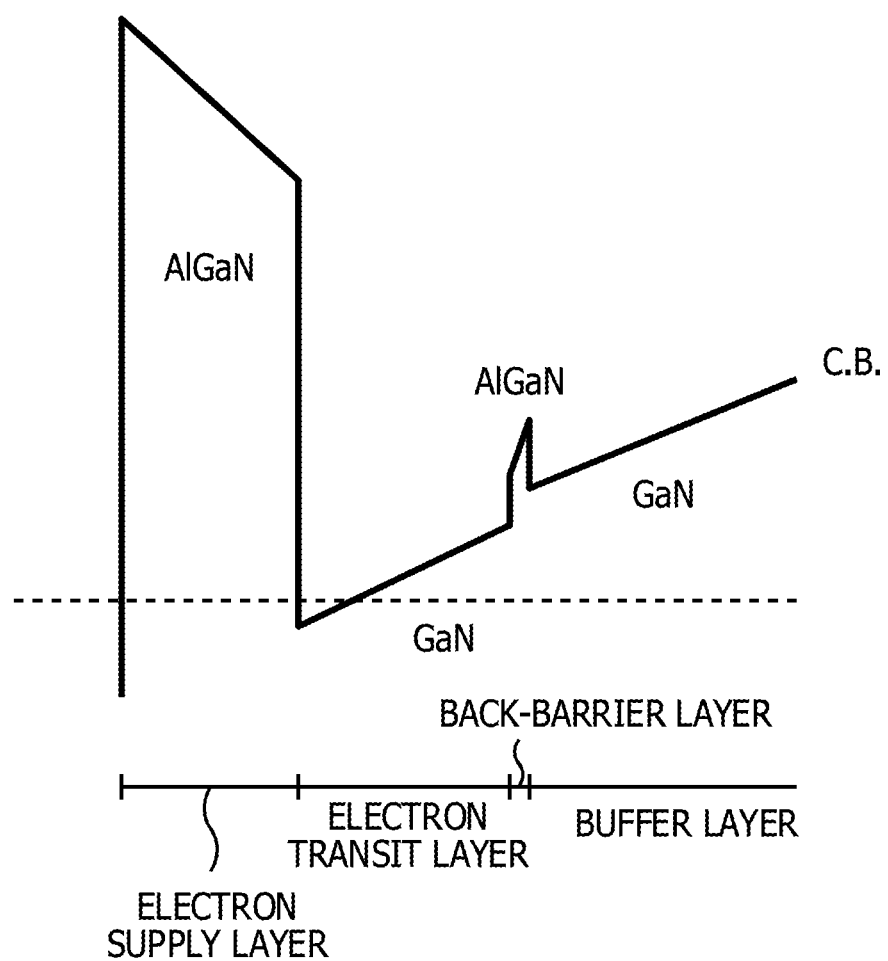
FIG. 17 is a characteristic diagram illustrating a band state of a conductor in an InAlGaN/GaN HEMT of a comparative example.

FIG. 17 illustrates a band state of a conductor in the InAlGaN/GaN HEMT of the comparative example. In this case, a barrier for an electron is formed due to the curvature of a conduction band caused by inverse piezoelectric charge, and discontinuity of conduction band potentials between i-GaN of the buffer layer and the electron transit layer and AlGaN of the back-barrier layer.

In the comparative example, a barrier for an electron is formed due to discontinuity of conduction band potentials between GaN of the buffer layer and the electron transit layer and AlGaN of the back-barrier layer. In the present embodiment, the reason why an electron is distributed at a high concentration despite the barrier being formed is concluded to be that a sufficient confinement effect for the electron is not exhibited without an increase in a potential of the entire conduction band in the buffer layer or the electron transit layer.

Figure 18A:
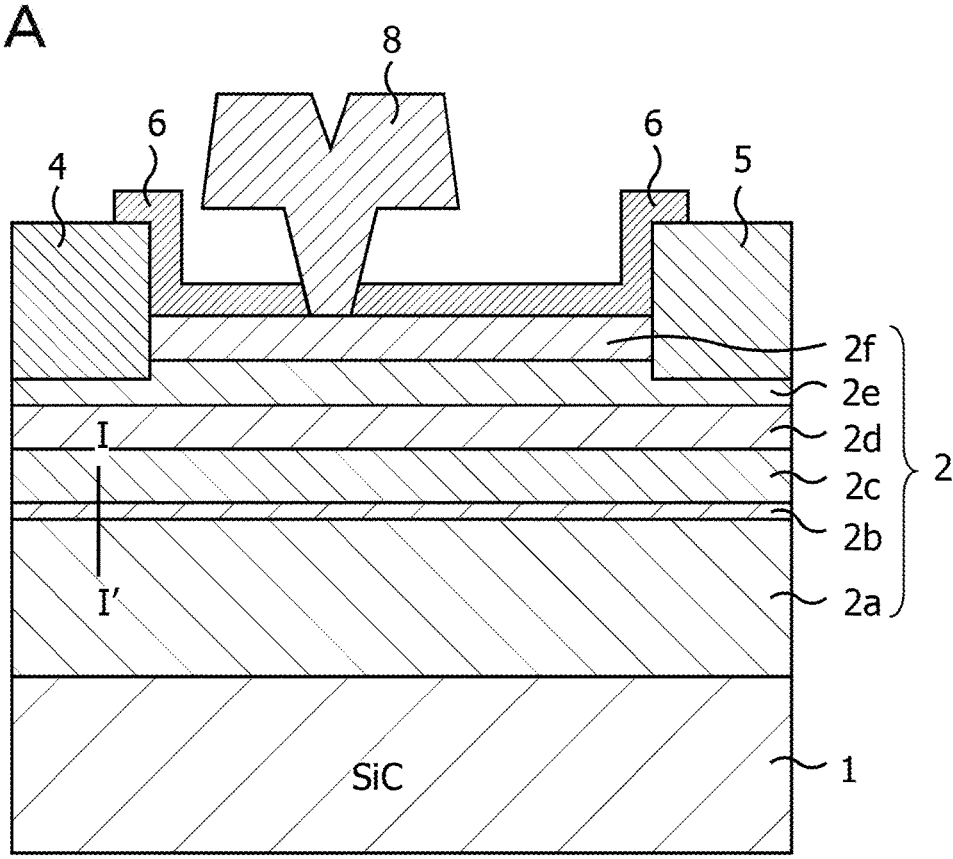
FIGS. 18A and 18B are schematic diagrams illustrating an Al composition of a back-barrier layer along with a schematic configuration of the InAlGaN/GaN HEMT according to the second embodiment (manufacturing method 2)
Figure 18B:
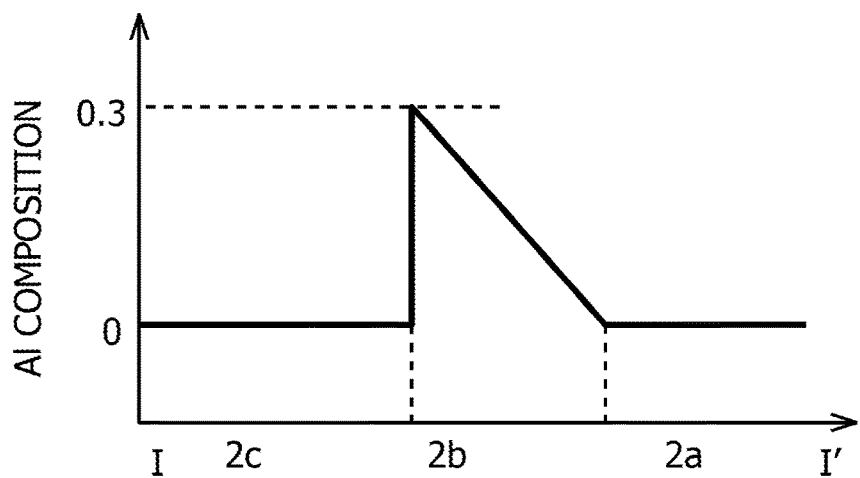

FIGS. 18A and 18B are schematic diagrams illustrating an Al composition of a back-barrier layer along with a schematic configuration of the InAlGaN/GaN HEMT according to the present embodiment (manufacturing method 2). FIG. 18A illustrates a schematic configuration of the InAlGaN/GaN HEMT, and FIG. 18B illustrates an Al composition of the back-barrier layer.

As illustrated in FIG. 18A, in the InAlGaN/GaN HEMT, the nitride semiconductor laminated structure 21 is provided with a negative charge layer (herein, the back-barrier layer 22) having negative charge on an upper surface thereof in inter-i-GaN of the electron transit layer (or the buffer layer) under a 2DEG. A portion in contact with a lower surface of the negative charge layer and a portion in contact with an upper surface of the negative charge layer are made of an identical material (i-GaN in FIGS. 18A and 18B) having an identical composition proportion. For example, the InAlGaN/GaN HEMT has remaining negative charge as a result of negative charge and positive charge canceling out each other at a position into which the back-barrier layer 22 of AlGaN is inserted. The presence of the negative charge may be checked according to a CV method or a microscopic EB method.

In the comparative example, positive fixed charge (spontaneous polarization charge and piezoelectric polarization charge) is generated in an interface of the back-barrier layer with the buffer layer, and negative fixed charge (spontaneous polarization charge and piezoelectric polarization charge) is generated in an interface of the back-barrier layer with the electron transit layer. Amounts of the negative fixed charge and the positive fixed charge are the same as each other, both thereof cancel out each other, and thus electric charge neutrality occurs.

In contrast, in the present embodiment, the back-barrier layer 22 has an Al composition as illustrated in FIG. 18B. For example, in the back-barrier layer 22, the Al composition continuously increases toward the interface with the electron transit layer 2c from the interface with the buffer layer 2a in the thickness direction, becomes the maximum value (for example, 30%) at the interface with the electron transit layer 2c, and the Al composition is reduced from 30% to 0% at the interface with the electron transit layer 2c. In the back-barrier layer 22, the Al composition continuously (gradually) changes at the interface with the buffer layer 2a, and thus part of the positive fixed charge is lost. Thus, in the back-barrier layer 22, the electric charge neutrality between the interface with the electron transit layer 2c and the interface with the buffer layer 2a collapses, and, as a result, an amount of the negative fixed charge is excessive. A potential of a conduction band of i-GaN in the electron transit layer 2c increases due to the negative fixed charge. Consequently, a sufficient confinement effect for an electron may be achieved, and thus suppression of a short channel effect is realized.

In the present embodiment, the back-barrier layer 22 has an Al composition distribution as described above, and may generate a sufficient amount of negative fixed charge even though the back-barrier layer 22 is thinner than a general back-barrier layer. Thus, current collapse may be reduced. For example, the back-barrier layer 22 in the present embodiment has a thickness of approximately 5 nm. Consequently, a pinch-off characteristic is improved by the back-barrier layer 22.

Figure 19A:
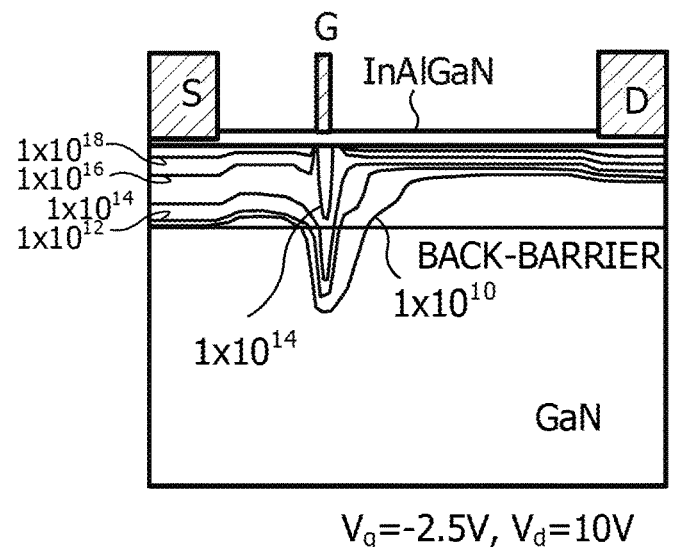
FIGS. 19A and 19B are schematic diagrams illustrating an electron distribution in the InAlGaN/GaN HEMT according to the second embodiment along with an electron distribution of the comparative example.
Figure 19A:
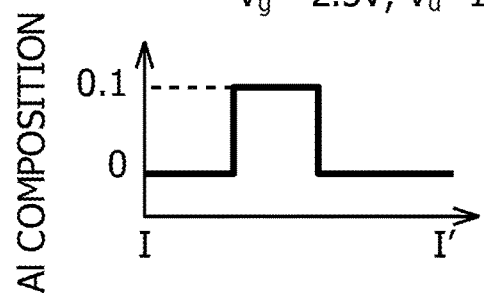
Figure 19B:
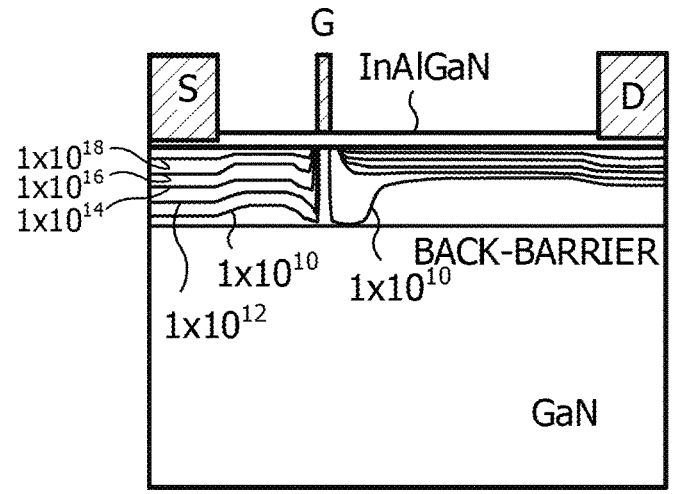
Figure 19B:
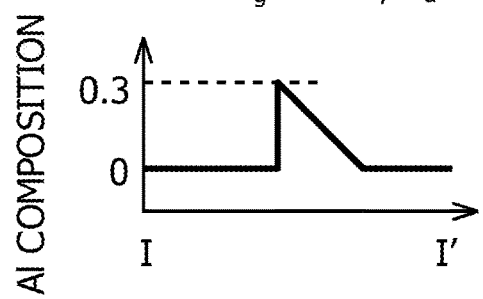

FIGS. 19A and 19B are schematic diagrams illustrating an electron distribution in the InAlGaN/GaN HEMT according to the present embodiment along with an electron distribution of the comparative example. FIG. 19A illustrates the comparative example, and FIG. 19B illustrates the present embodiment.

In the comparative example, a high electron concentration region which is distributed to be bent directly under the gate electrode is recognized, but, in the present embodiment, it may be seen that formation of the electron concentration region is suppressed.

Figure 20:
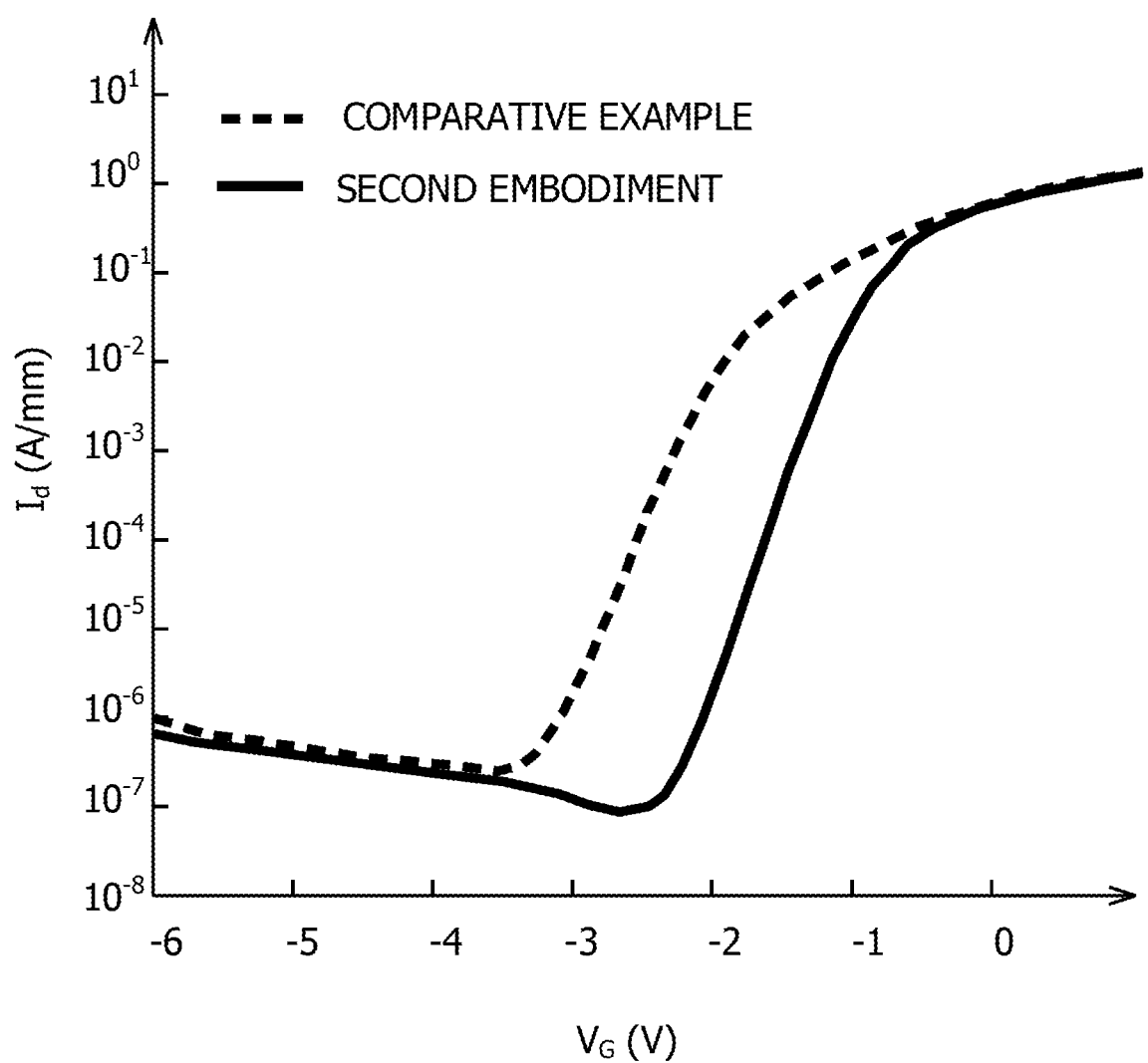
FIG. 20 is a schematic diagram illustrating an electron distribution in the InAlGaN/GaN HEMT according to the second embodiment along with an electron distribution of the comparative example.

FIG. 20 is a schematic diagram illustrating I-V characteristics of the InAlGaN/GaN HEMT according to the present embodiment along with I-V characteristics of the comparative example. A dashed line indicates the comparative example, and a solid line indicates the present embodiment.

In the comparative example, a high electron concentration region which is distributed to be bent directly under the gate electrode is recognized, but, in the present embodiment, it may be seen that formation of the electron concentration region is suppressed.

In the present embodiment, it is assumed that an Al composition in the vicinity of the interface of the back-barrier layer 22 with the buffer layer 2a, for example, the maximum value of the Al composition in the back-barrier layer 22 is 5% to 35%, for example, 30%. In a case where the maximum value is smaller than 5%, the effect of the back-barrier layer is reduced, and, in a case where the maximum value is greater than 35%, crystal quality deteriorates, and a trap concentration increases. Therefore, the above range is preferable.

Also in the present embodiment, in the same manner as in the first embodiment, preferably, the back-barrier layer 22 contains carbon (C), and a lower surface side has a carbon concentration higher than that of an upper surface side.

The back-barrier layer 22 has a larger amount of negative charge in the interface with the electron transit layer 2c than an amount of positive charge in the interface with the buffer layer 2a by, for example, 10% or less.

The back-barrier layer 22 is preferably located within a distance of approximately 40 nm from the upper surface of the electron transit layer 2c which is a hetero interface (for example, a thickness of the electron transit layer 2c is approximately 40 nm or less).

As described above, according to the present embodiment, an InAlGaN/GaN HEMT having high reliability which realizes sufficient suppression of a short channel effect is implemented. In the InAlGaN/GaN HEMT, an increase in current collapse due to the presence of a back-barrier layer may be suppressed, and thus the current collapse may be alleviated.

Figure 21:
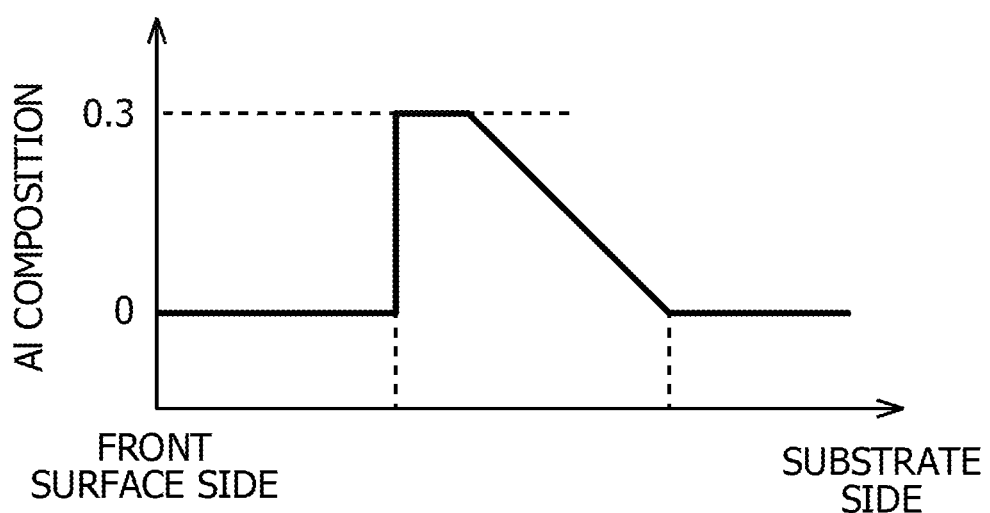
FIG. 21 is a characteristic diagram illustrating another example of an Al composition of the InAlGaN/GaN HEMT according to the second embodiment.

In the present embodiment, the back-barrier layer 22 of AlGaN may be formed to have an Al composition including a portion where an Al composition is uniform, for example, as illustrated in FIG. 21.

In this case, in order to cause AlGaN forming the back-barrier layer 22 to grow, a flow rate of a TMA gas is adjusted such that an Al composition continuously increases from 0% to the maximum value toward an upper surface (an interface with the electron transit layer 2c when the electron transit layer 2c is formed) from an interface with the buffer layer 2a, the maximum value is maintained for a predetermined time, and then the Al composition is reduced to 0% at the interface with the electron transit layer 2c. The maximum value of the Al composition is set to, for example, approximately 30%.

Consequently, in the back-barrier layer 22, the Al composition continuously increases toward the interface with the electron transit layer 2c from the interface with the buffer layer 2a in the thickness direction, becomes the maximum value (for example, 30%) at the interface with the electron transit layer 2c, the maximum value is maintained by a slight thickness, and the Al composition is reduced from the maximum value to 0% at the interface with the electron transit layer 2c.

Even in this case, an electron distribution as illustrated in FIG. 19B is obtained, and formation of a high electron concentration region which is distributed to be bent directly under the gate electrode as illustrated in FIG. 19A is suppressed, and thus a short channel effect may be sufficiently suppressed.

Modification Example

Hereinafter, a description will be made of a modification example of the second embodiment. In the present modification example, a back-barrier layer made of InAlGaN is formed instead of a back-barrier layer made of AlGaN in the second embodiment.

In the present modification example, in either manufacturing method 1 or 2, InAlGaN is accumulated instead of AlGaN forming the back-barrier layer 22 according to an MOVPE method.

In the present modification example, in order to cause InAlGaN forming the back-barrier layer to grow, flow rates of a TMA gas and a TMI gas are adjusted such that a sum of an In composition and an Al composition continuously increases from 0% toward an upper surface (an interface with the electron transit layer 2c when the electron transit layer 2c is formed) from an interface with the buffer layer 2a, becomes the maximum value at the upper surface, and is reduced stepwise (rapidly) to 0% at the upper surface. The maximum value of the sum of the In composition and the Al composition is set to, for example, approximately 80%.

Figure 22A:
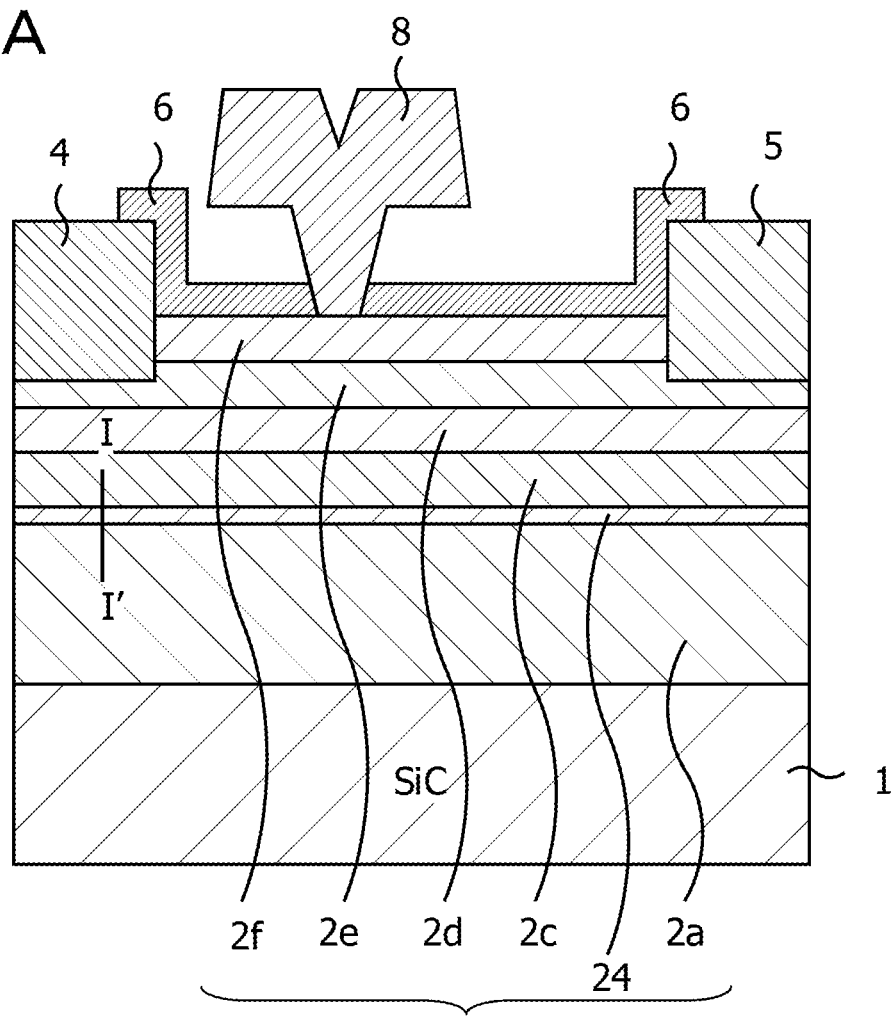
FIGS. 22A and 22B are schematic diagrams illustrating a group III element composition (a sum of an In composition and an Al composition) of a back-barrier layer along with a schematic configuration of an InAlGaN/GaN HEMT according to a modification example of the second embodiment (manufacturing method 2)
Figure 22B:
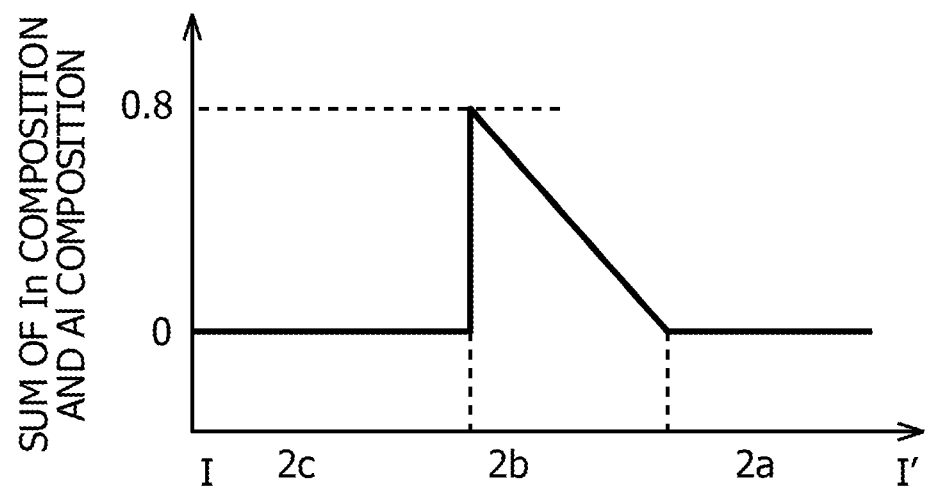

FIGS. 22A and 22B are schematic diagrams illustrating a group III element composition (a sum of an In composition and an Al composition) of a back-barrier layer along with a schematic configuration of an InAlGaN/GaN HEMT according to the modification example of the present embodiment (manufacturing method 2). FIG. 22A illustrates a schematic configuration of the InAlGaN/GaN HEMT, and FIG. 22B illustrates a group III element composition of a back-barrier layer.

As illustrated in FIG. 22A, in the InAlGaN/GaN HEMT, a nitride semiconductor laminated structure 23 is provided with a negative charge layer (herein, a back-barrier layer 24) having negative charge on an upper surface thereof in inter-i-GaN of the electron transit layer (or the buffer layer) under a 2DEG. A portion in contact with a lower surface of the negative charge layer and a portion in contact with an upper surface of the negative charge layer are made of an identical material (i-GaN in FIGS. 22A and 22B) of an identical composition proportion. For example, the InAlGaN/GaN HEMT has remaining negative charge as a result of negative charge and positive charge canceling out each other at a position into which the back-barrier layer 24 of InAlGaN is inserted. The presence of the negative charge may be checked according to a CV method or a microscopic EB method.

In the present modification example, the back-barrier layer 24 has a distribution of a group III element composition (a sum of an In composition and an Al composition) as illustrated in FIG. 22B. For example, in the back-barrier layer 24, the group III element composition continuously increases toward the interface with the electron transit layer 2c from the interface with the buffer layer 2a in the thickness direction, becomes the maximum value (for example, 80%) at the interface with the electron transit layer 2c, and the group III element composition is reduced from 80% to 0% at the interface with the electron transit layer 2c. In the back-barrier layer 24, the group III element composition continuously (gradually) changes at the interface with the buffer layer 2a, and thus part of the positive fixed charge is lost. Thus, in the back-barrier layer 24, the electric charge neutrality between the interface with the electron transit layer 2c and the interface with the buffer layer 2a collapses, and, as a result, an amount of the negative fixed charge is excessive. A potential of a conduction band of i-GaN in the electron transit layer 2c increases due to the negative fixed charge. Consequently, a sufficient confinement effect for an electron may be achieved, and thus suppression of a short channel effect is realized.

In the present modification example, the back-barrier layer 24 has the distribution of the group III element composition as described above, and may generate a sufficient amount of negative fixed charge even though the back-barrier layer 24 is thinner than a general back-barrier layer. Thus, current collapse may be reduced. For example, the back-barrier layer 24 in the present modification example has a thickness of approximately 5 nm. Consequently, a pinch-off characteristic is improved by the back-barrier layer 24, and thus current collapse is alleviated.

In the present modification example, it is assumed that a group III element composition in the vicinity of the interface of the back-barrier layer 24 with the buffer layer 2a, for example, the maximum value of the sum of the In composition and the Al composition in the back-barrier layer 24 is 50% to 80%, for example, 80%. In a case where the maximum value is smaller than 50%, the effect of the back-barrier layer is reduced, and a drain leakage current increases, and, in a case where the maximum value is greater than 80%, crystal quality deteriorates, and a trap is generated. Therefore, the above range is preferable.

Also in the present modification example, in the same manner as in the second embodiment, preferably, the back-barrier layer 24 contains carbon (C), and a lower surface side has a carbon concentration higher than that of an upper surface side.

The back-barrier layer 24 has a larger amount of negative charge in the interface with the electron transit layer 2c than an amount of positive charge in the interface with the buffer layer 2a by, for example, 10% or less.

The back-barrier layer 24 is preferably located within a distance of approximately 40 nm from the upper surface of the electron transit layer 2c which is a hetero interface (for example, a thickness of the electron transit layer 2c is approximately 40 nm or less).

As described above, according to the present modification example, an InAlGaN/GaN HEMT having high reliability which realizes sufficient suppression of a short channel effect is implemented. In the InAlGaN/GaN HEMT, an increase in current collapse due to the presence of a back-barrier layer may be suppressed, and thus the current collapse may be alleviated.

In the present modification example, the back-barrier layer 24 of InAlGaN may be formed to have a group III element composition including a portion where a group III element composition (a sum of an In composition and an Al composition) is uniform, for example, as illustrated in FIG. 21.

In this case, in order to cause InAlGaN forming the back-barrier layer 24 to grow, flow rates of a TMI gas and a TMA gas are adjusted such that a group III element composition continuously increases from 0% to the maximum value at an interface with the buffer layer 2a toward an upper surface (an interface with the electron transit layer 2c when the electron transit layer 2c is formed) from an interface with the buffer layer 2a, the maximum value is maintained for a predetermined time, and then the group III element composition is reduced to 0% at the interface with the electron transit layer 2c. The maximum value of the group III element composition is set to, for example, approximately 80%.

Consequently, in the back-barrier layer 24, the group III element composition continuously increases toward the interface with the electron transit layer 2c from the interface with the buffer layer 2a in the thickness direction, becomes the maximum value (for example, 80%) at the interface with the electron transit layer 2c, the maximum value is maintained by a slight thickness, and the group III element composition is reduced from the maximum value to 0% at the interface with the electron transit layer 2c.

Even in this case, an electron distribution as illustrated in FIG. 19B is obtained, and formation of a high electron concentration region which is distributed to be bent directly under the gate electrode as illustrated in FIG. 19A is suppressed, and thus a short channel effect may be sufficiently suppressed.

In the first and second embodiments and the modification example of the second embodiment, as a nitride semiconductor device, an InAlGaN/GaN HEMT has been described, but not only the InAlGaN/GaN HEMT but also, for example, an AlGaN/GaN HEMT, an InAlN/GaN HEMT, or an AlN/GaN HEMT may be employed.

Third Embodiment

In the present embodiment, a description will be made of a power source device to which a single InAlGaN/GaN HEMT selected from the first and second embodiments and the modification example is applied.

Figure 23:
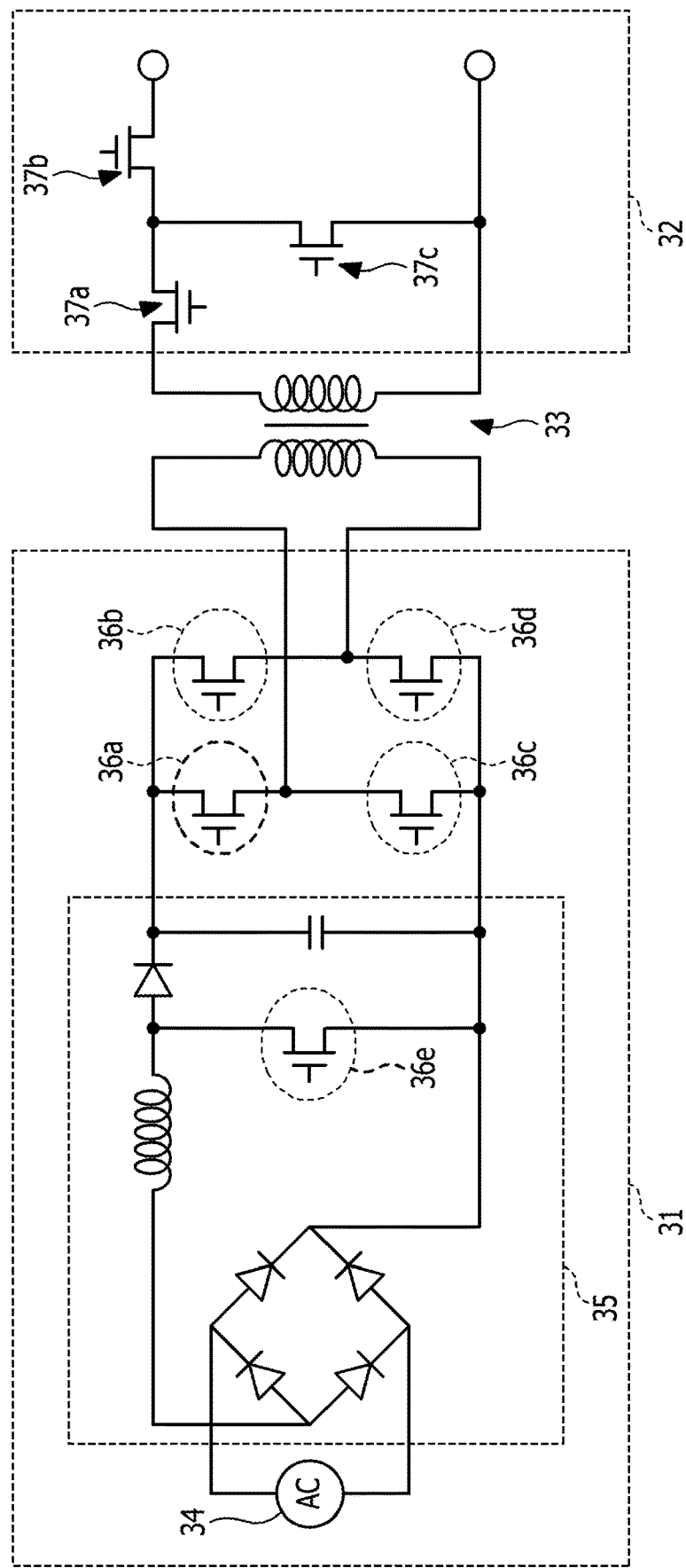
FIG. 23 is a connection block diagram illustrating a schematic configuration of a power source device according to a third embodiment.

FIG. 23 is a connection block diagram illustrating a schematic configuration of a power source device according to a third embodiment.

The power source device according to the present embodiment is configured to include a high-voltage primary circuit 31, a low-voltage secondary circuit 32, and a transformer 33 disposed between the primary circuit 31 and the secondary circuit 32.

The primary circuit 31 is configured to include an AC power source 34, a so-called bridge rectification circuit 35, and a plurality of (for example, four) switching elements 36a, 36b, 36c, and 36d. The bridge rectification circuit 35 includes a switching element 36e.

The secondary circuit 32 is configured to include a plurality of (for example, three) switching elements 37a, 37b, and 37c.

In the present embodiment, each of the switching elements 36a, 36b, 36c, 36d, and 36e of the primary circuit 31 is configured with a single InAlGaN/GaN HEMT selected from the first and second embodiments and the modification example. On the other hand, each of the switching elements 37a, 37b, and 37c of the secondary circuit 32 is configured with a general MIS FET using silicon.

In the present embodiment, the InAlGaN/GaN HEMT which has high reliability and realizes both of suppression of a short channel effect and alleviation of current collapse is applied to a high-voltage circuit. Consequently, a large-power power source circuit having high reliability is implemented.

Fourth Embodiment

In the present embodiment, a description will be made of a high frequency amplifier to which a single InAlGaN/GaN HEMT selected from the first and second embodiments and the modification example is applied.

Figure 24:
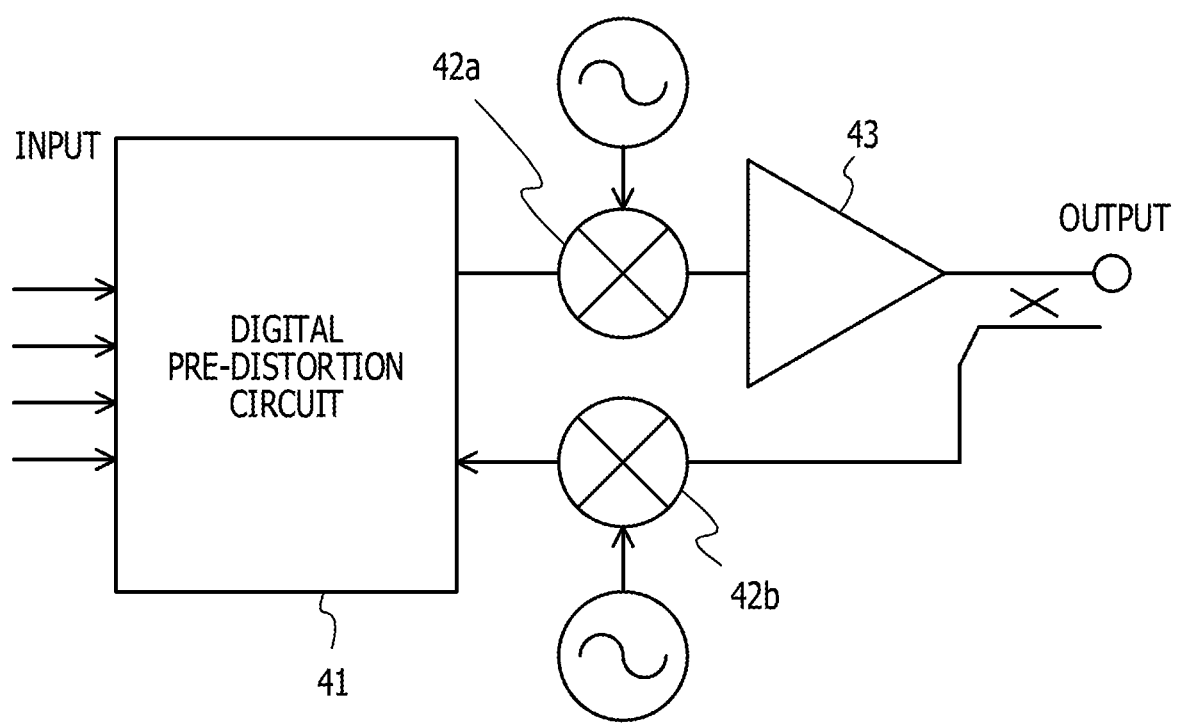
FIG. 24 is a connection block diagram illustrating a schematic configuration of a high frequency amplifier according to a fourth embodiment.

FIG. 24 is a connection block diagram illustrating a schematic configuration of a high frequency amplifier according to a fourth embodiment.

The high frequency amplifier according to the present embodiment is configured to include a digital pre-distortion circuit 41, mixers 42a and 42b, and a power amplifier 43.

The digital pre-distortion circuit 41 compensates for nonlinear distortion of an input signal. The mixer 42a mixes the input signal of which the nonlinear distortion is compensated for with an AC signal. The power amplifier 43 amplifies the input signal mixed with the AC signal, and has a single InAlGaN/GaN HEMT selected from the first and second embodiments and the modification example. In FIG. 24, a signal on the output side is mixed with an AC signal in the mixer 42b through, for example, switching of a switch, and is sent to the digital pre-distortion circuit 41.

In the present embodiment, the InAlGaN/GaN HEMT which has high reliability and realizes both of suppression of a short channel effect and alleviation of current collapse is applied to a high frequency amplifier. Consequently, a high frequency amplifier having high reliability and a high breakdown voltage is implemented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A nitride semiconductor device comprising:
   a first nitride semiconductor layer;
   a back-barrier layer that contains InGaN provided on the first nitride semiconductor layer; and a second nitride semiconductor layer that is provided on the back-barrier layer,
wherein, in the back-barrier layer, in a thickness direction, an In composition increases at a first interface with the first nitride semiconductor layer from a minimum value to a maximum value, and the In composition is continuously reduced toward a second interface with the second nitride semiconductor layer from the maximum value to the minimum value,
wherein the minimum value is 0%,
wherein the maximum value is 5% to 20%.

2. A nitride semiconductor device comprising:
a first nitride semiconductor layer;
a back-barrier layer that contains AlGaN provided on the first nitride semiconductor layer; and
a second nitride semiconductor layer that is provided on the back-barrier layer,
wherein, in the back-barrier layer, in a thickness direction, an Al composition continuously increases toward an interface with the second nitride semiconductor layer from a minimum value to a maximum value, and the Al composition is reduced at the interface from the maximum value to the minimum value,
wherein the minimum value is 0%,
wherein the maximum value is 5% to 35%.

3. A nitride semiconductor device comprising:
a first nitride semiconductor layer;
a back-barrier layer that contains InAlGaN provided on the first nitride semiconductor layer; and
a second nitride semiconductor layer that is provided on the back-barrier layer,
wherein, in the back-barrier layer, in a thickness direction, a sum of an In composition and an Al composition continuously increases toward an interface with the second nitride semiconductor layer from a minimum value to the maximum value, and the sum of the In composition and the Al composition is reduced at the interface from the maximum value to the minimum value,
wherein the minimum value is 0%,
wherein a maximum value is 50% to 80%.

4. The nitride semiconductor device according to claim 1, wherein the back-barrier layer includes a portion in which the In composition is uniform in the thickness direction.

5. The nitride semiconductor device according to claim 2, wherein the back-barrier layer includes a portion in which the Al composition is uniform in the thickness direction.

6. The nitride semiconductor device according to claim 3, wherein the back-barrier layer includes a portion in which the sum of the In composition and the Al composition is uniform in the thickness direction.

7. The nitride semiconductor device according to claim 1, wherein the second interface of the back-barrier layer is located within a distance of 40 nm from an upper surface of the second nitride semiconductor layer.

8. The nitride semiconductor device according to claim 2, wherein the interface of the back-barrier layer is located within a distance of 40 nm from an upper surface of the second nitride semiconductor layer.

9. The nitride semiconductor device according to claim 3, wherein the interface of the back-barrier layer is located within a distance of 40 nm from an upper surface of the second nitride semiconductor layer.

10. The nitride semiconductor device according to claim 1, wherein, in the back-barrier layer, a maximum value of the In composition is 5% to 20%.

11. The nitride semiconductor device according to claim 2, wherein, in the back-barrier layer, a maximum value of the Al composition is 5% to 35%.

12. The nitride semiconductor device according to claim 3, wherein, in the back-barrier layer, a maximum value of the sum of the In composition and the Al composition is 50% to 80%.

13. The nitride semiconductor device according to claim 1, wherein
the first nitride semiconductor layer, the back-barrier layer, and the second nitride semiconductor layer contain carbon, and
a side of the first nitride semiconductor layer has a carbon concentration higher than a carbon concentration of a side of the second nitride semiconductor layer.

14. The nitride semiconductor device according to claim 1, wherein the back-barrier layer has a larger amount of negative charge in the first interface than an amount of positive charge in the second interface by 10% or less.

15. The nitride semiconductor device according to claim 2, wherein the back-barrier layer has a larger amount of negative charge in the interface than an amount of positive charge in an interface with the first nitride semiconductor layer by 10% or less.

16. The nitride semiconductor device according to claim 1, wherein a thickness of the back-barrier layer is equal to or less than 5 nm.

17. The nitride semiconductor device according to claim 1, further comprising:
a gate electrode,
wherein a gate length of the gate electrode is equal to or less than 0.3 μm.

18. A manufacturing method for a nitride semiconductor device, comprising:
forming a back-barrier layer containing InGaN on a first nitride semiconductor layer; and
forming a second nitride semiconductor layer on the back-barrier layer,
wherein, in the back-barrier layer, in a thickness direction, an In composition increases at a first interface with the first nitride semiconductor layer from a minimum value to a maximum value, and the In composition is continuously reduced toward a second interface with the second nitride semiconductor layer from the maximum value to the minimum value,
wherein the minimum value is 0%,
wherein the maximum value is 5% to 20%.

19. A manufacturing method for a nitride semiconductor device, comprising:
forming a back-barrier layer containing AlGaN on a first nitride semiconductor layer; and
forming a second nitride semiconductor layer on the back-barrier layer,
wherein, in the back-barrier layer, in a thickness direction, an Al composition continuously increases toward an interface with the second nitride semiconductor layer from a minimum value to a maximum value, and the Al composition is reduced at the interface from the maximum value to the minimum value, wherein the minimum value is 0%, wherein the maximum value is 5% to 35%.

20. A manufacturing method for a nitride semiconductor device, comprising:

forming a back-barrier layer containing InAlGaN on a first nitride semiconductor layer; and forming a second nitride semiconductor layer on the back-barrier layer, wherein, in the back-barrier layer, in a thickness direction, a sum of an In composition and an Al composition continuously increases toward an interface with the second nitride semiconductor layer from a minimum value to the maximum value, and the sum of the In composition and the Al composition is reduced at the interface from the maximum value to the minimum value, wherein the minimum value is 0%, wherein a maximum value is 50% to 80%.

21. The manufacturing method according to claim 18, wherein the second interface of the back-barrier layer is located within a distance of 40 nm from an upper surface of the second nitride semiconductor layer.

22. The manufacturing method according to claim 19, wherein the interface of the back-barrier layer is located within a distance of 40 nm from an upper surface of the second nitride semiconductor layer.

23. The manufacturing method according to claim 20, wherein the interface of the back-barrier layer is located within a distance of 40 nm from an upper surface of the second nitride semiconductor layer.

24. The manufacturing method according to claim 18, wherein p1 the first nitride semiconductor layer, the back-barrier layer, and the second nitride semiconductor layer contain carbon, and a side of the first nitride semiconductor layer has a carbon concentration higher than a carbon concentration of a side of the second nitride semiconductor layer.

25. The manufacturing method according to claim 18, wherein a thickness of the back-barrier layer is equal to or less than 5 nm.

26. The manufacturing method according to claim 18, wherein the back-barrier layer has a larger amount of negative charge in the first interface than an amount of positive charge in the second interface by 10% or less.

27. The manufacturing method according to claim 19, wherein the back-barrier layer has a larger amount of negative charge in the interface than an amount of positive charge in an interface with the first nitride semiconductor layer by 10% or less.

* * * * *